(12) United States Patent
Whetsel

(10) Patent No.: US 9,671,426 B2
(45) Date of Patent: Jun. 6, 2017

(54) RESPONSE COLLECTOR CIRCUITRY COUPLED WITH THROUGH SILICON VIA AND TAP

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/826,617

(22) Filed: Aug. 14, 2015

(65) Prior Publication Data

US 2015/0355232 A1    Dec. 10, 2015
US 2017/0131325 A9    May 11, 2017

Related U.S. Application Data

(62) Division of application No. 14/635,656, filed on Mar. 2, 2015, now Pat. No. 9,146,276, which is a division of application No. 13/495,451, filed on Jun. 13, 2012, now abandoned.

(60) Provisional application No. 61/498,714, filed on Jun. 20, 2011.

(51) Int. Cl.
| | |
|---|---|
| *G01R 31/26* | (2014.01) |
| *G01R 1/04* | (2006.01) |
| *B05C 21/00* | (2006.01) |
| *B44D 3/12* | (2006.01) |
| *G01R 31/28* | (2006.01) |
| *G01R 31/42* | (2006.01) |

(52) U.S. Cl.
CPC ............ *G01R 1/0416* (2013.01); *B05C 21/00* (2013.01); *B44D 3/126* (2013.01); *G01R 31/26* (2013.01); *G01R 31/2853* (2013.01)

(58) Field of Classification Search
CPC .. G01R 1/0416; G01R 31/26; G01R 31/2853; G01R 31/3177; G01R 31/3187; G01R 31/3193; G01R 31/31937; G01R 31/31813; G01R 31/318307; G01R 31/31701; G01R 31/318538; G01R 31/2889; G11C 29/56; G11C 29/48; G11C 29/40; B05C 21/00; B44D 3/126
See application file for complete search history.

(56) References Cited

U.S. PATENT DOCUMENTS

| | | | |
|---|---|---|---|
| 2004/0177298 A1* | 9/2004 | Farnworth | G01R 31/31701 714/724 |
| 2004/0225937 A1* | 11/2004 | Ong | G01R 31/31715 714/724 |
| 2006/0248419 A1* | 11/2006 | Colunga | G01R 31/318555 714/727 |

\* cited by examiner

*Primary Examiner* — April Y Blair
*Assistant Examiner* — Dipakkumar Gandhi
(74) *Attorney, Agent, or Firm* — Lawrence J. Bassuk; Charles A. Brill; Frank D. Cimino

(57) ABSTRACT

The disclosure describes a novel method and apparatus for improving silicon interposers to include test circuitry for testing stacked die mounted on the interposer. The improvement allows for the stacked die to be selectively tested by an external tester or by the test circuitry included in the interposer.

6 Claims, 32 Drawing Sheets

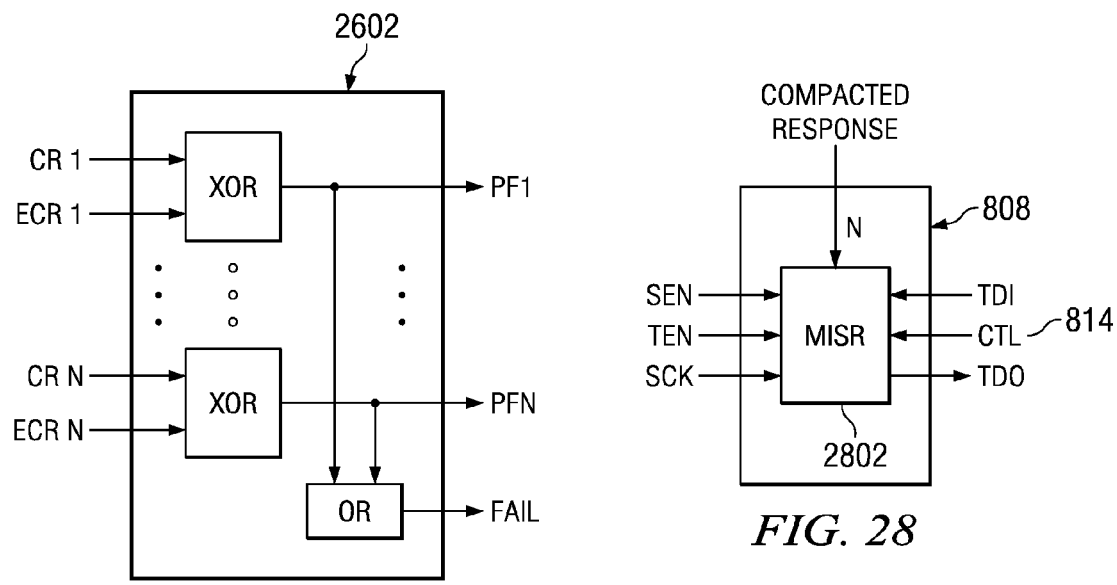
*FIG. 27*
*FIG. 28*
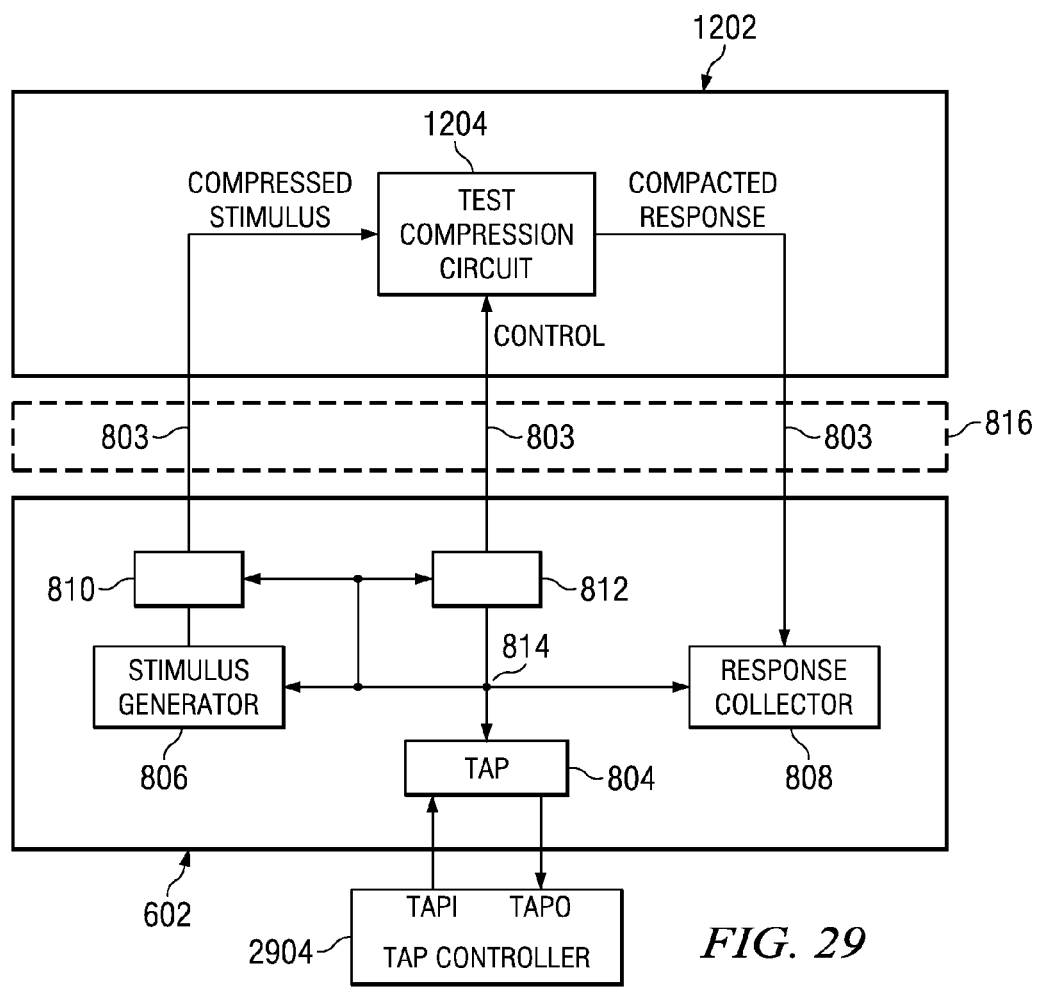
*FIG. 29*

RESPONSE COLLECTOR CIRCUITRY COUPLED WITH THROUGH SILICON VIA AND TAP

FIELD OF THE DISCLOSURE

This application is a divisional of prior application Ser. No. 14/635,656, filed Mar. 2, 2015, now U.S. Pat. No. 9,146,276, issued Sep. 29, 2015;

Which was a divisional of prior application Ser. No. 13/495,451, filed Jun. 13, 2012, now abandoned;

Which claims priority from Provisional Application No. 61/498,714, filed Jun. 20, 2011.

This disclosure relates generally to silicon interposers and specifically to silicon interposers that, according to the disclosure, include embedded test circuitry.

BACKGROUND OF THE DISCLOSURE

Integrated circuit die may be designed such that they may be stacked on top of one another to form a stacked die arrangement. The stacked die arrangement may be further mounted upon a silicon interposer layer/die. The silicon interposer serves as a signal redistribution layer for connecting the fine pitch contact points of the stacked die to wider pitch contact points of a substrate, such as, but not limited too, a board. Prior to mounting onto a substrate the stacked die and interposer ensemble must be tested to assure goodness. Testing is done by connecting a tester to the interposer and applying test patterns to the stacked die via the interposer.

FIG. 1 illustrates a device 100 including a stack of die 102-104 mounted upon a conventional silicon interposer 106. The interposer 106 is further mounted to a substrate 108, such as, but not limited too, a smart phone printed circuit board (PCB), a desk top computer PCB, a lap top computer PCB, a tablet PCB or another die. The die 102-104 in this example are designed using Through Silicon Vias (TSV) 110. TSVs are connectivity paths formed between the top and bottom surfaces of the die. TSVs allow substrate input 118 and output 120 signals to flow vertically up and down the die stack via the interposer to provide input to and output from the die circuitry 112 of each die. The die 102-104 are locally connected together via connections 114. The signal connections between die 102 and 104, between die 104 and interposer 106 and between interposer 106 and substrate 108 are indicated by contact points 116.

FIG. 2 is provided to illustrate the redistribution layer function of the interposer 106 to spread connections from fine pitch contact points 116 of die 104 to wider pitch contact points 116 of the substrate 108.

FIG. 3 is a schematic representation of the die stack and interposer of FIG. 1 that will be used to facilitate the description of the disclosure. For simplicity, the local die connections 114 are not shown in FIG. 3.

FIG. 4 illustrates die circuitry 112 which includes functional circuitry 402 for performing the functional operation of the die and embedded test circuitry 404 for testing the functional circuitry. The inputs 118 and outputs 120 of the die circuitry 112 are coupled to the functional 402 and test circuitry 404. During functional operations the functional circuitry operates by inputting functional signals from inputs 118 and outputting functional signals to outputs 120. During test operations the test circuitry operates by inputting test stimulus and test control signals from some or all of the inputs 118 and outputting test response signals to some or all of the outputs 120.

FIG. 5 illustrates a tester 502 connected to the interposer 106 to input stimulus (S) and control (C) signals to the test circuitry 404 of die 102 and 104 and to receive response (R) signals from the test circuitry 404 of die 102 and 104. The stimulus and control signals are input from the tester using some or all of the inputs 118 and the response signals are output to the tester using some or all of the outputs 120.

The following disclosure describes a new method of controlling the test circuitry 404 of die 102 and 104. The new method is achieved by embedding die test and access circuitry within the interposer 106.

BRIEF SUMMARY OF THE DISCLOSURE

This disclosure describes an interposer that is improved to include testing circuitry and IEEE 1149.1 Test Access Port (TAP) circuitry. The improved test interposer can be used in place of conventional interposers 106 to facilitate the testing of a die or a stack of die mounted thereupon.

BRIEF DESCRIPTIONS OF THE VIEWS OF THE DRAWINGS

FIG. 27 illustrates a pass/fail response comparator.

FIG. 28 illustrates a response collector circuit of the disclosure.

FIG. 29 illustrates a test compression circuit being tested by the test interposer.

DETAILED DESCRIPTION OF THE DISCLOSURE

Figure 1:
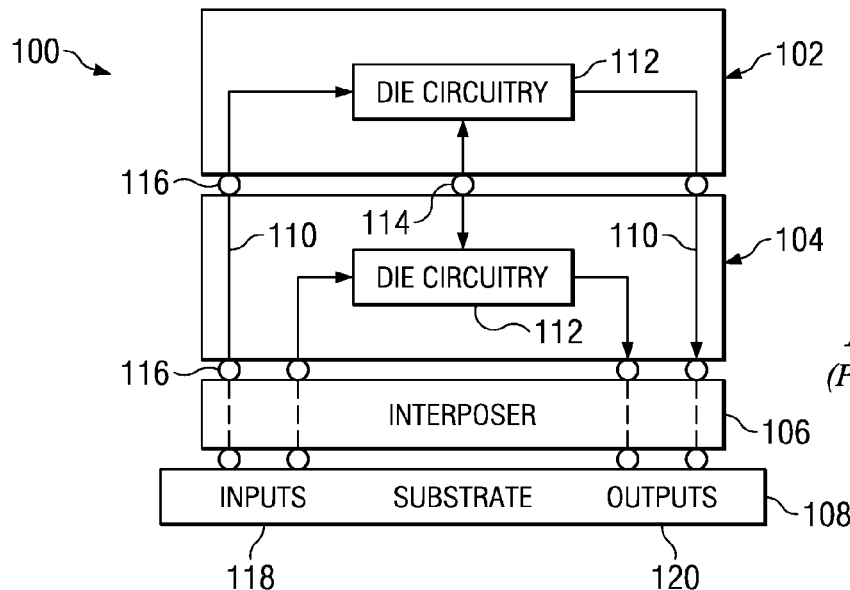
FIG. 1 illustrates stacked die on an interposer mounted on a substrate.
Figure 2:
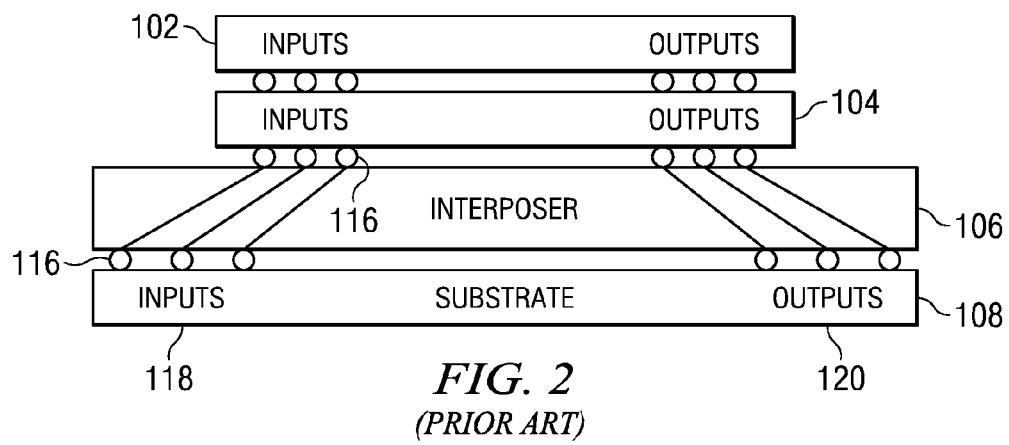
FIG. 2 illustrates the input and output signal redistribution function of the interposer.
Figure 3:
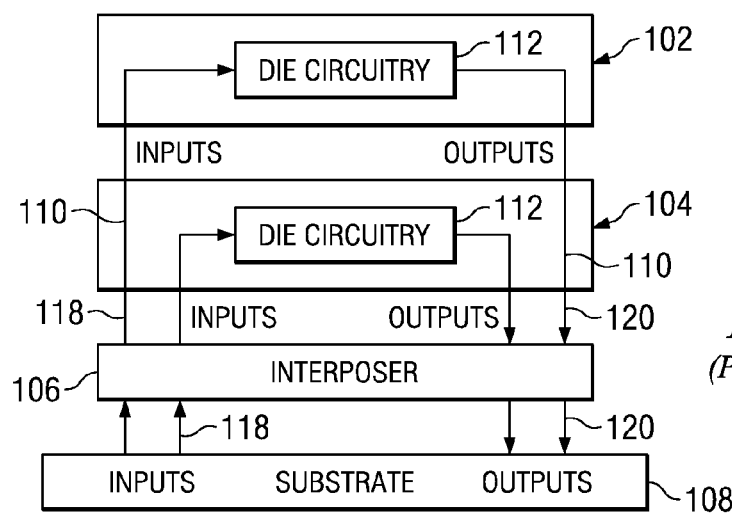
FIG. 3 illustrates an alternate view of FIG. 1.
Figure 6:
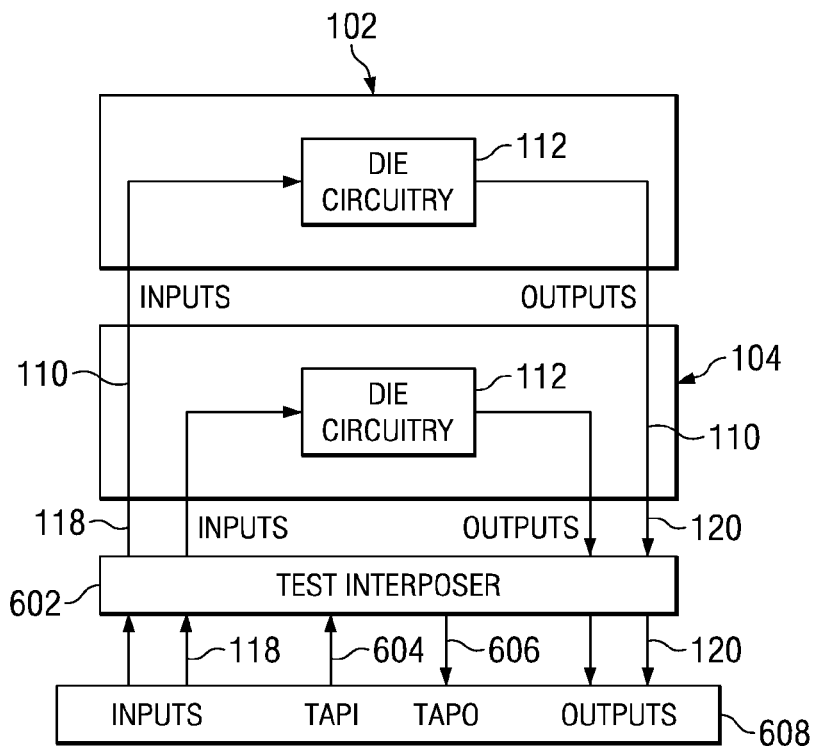
FIG. 6 illustrates stacked die on a test interposer connected to a tester, according to the disclosure.

FIG. 6 illustrates the die stack of FIG. 3 with the conventional interposer 106 being replaced with the test interposer 602 of the present disclosure. The test interposer 602 is similar to the conventional interposer 106 of FIG. 3 in that in functional mode it can pass functional inputs 118 from a substrate 608 to the functional circuitry of die circuitry 112 and pass functional outputs 120 from the functional circuitry of die circuitry 112 to the substrate 608.

Figure 5:
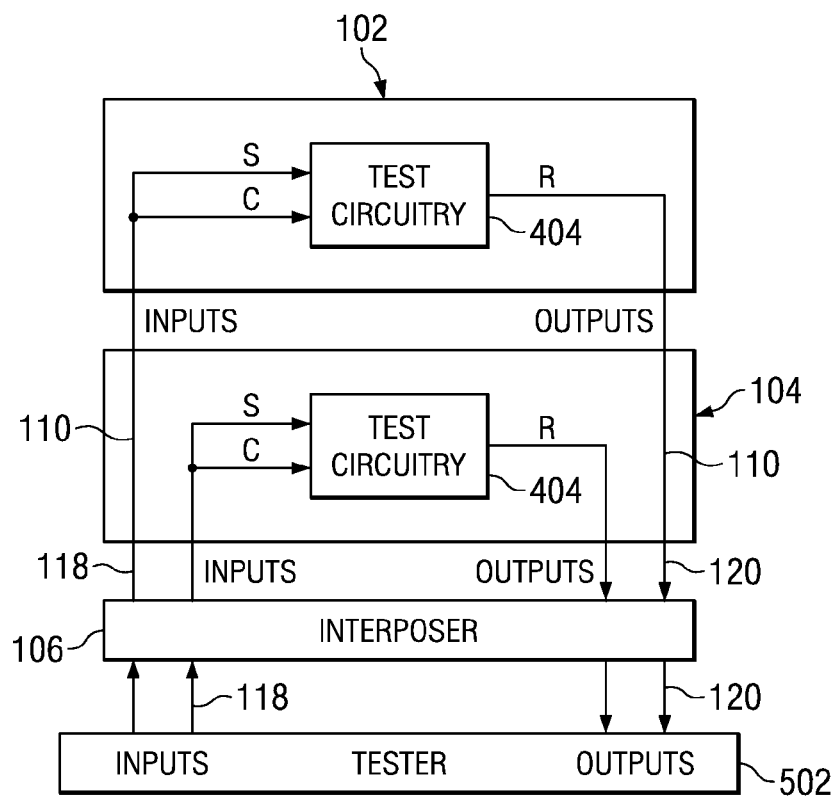
FIG. 5 illustrates stacked die on an interposer connected to a tester.
Figure 7:
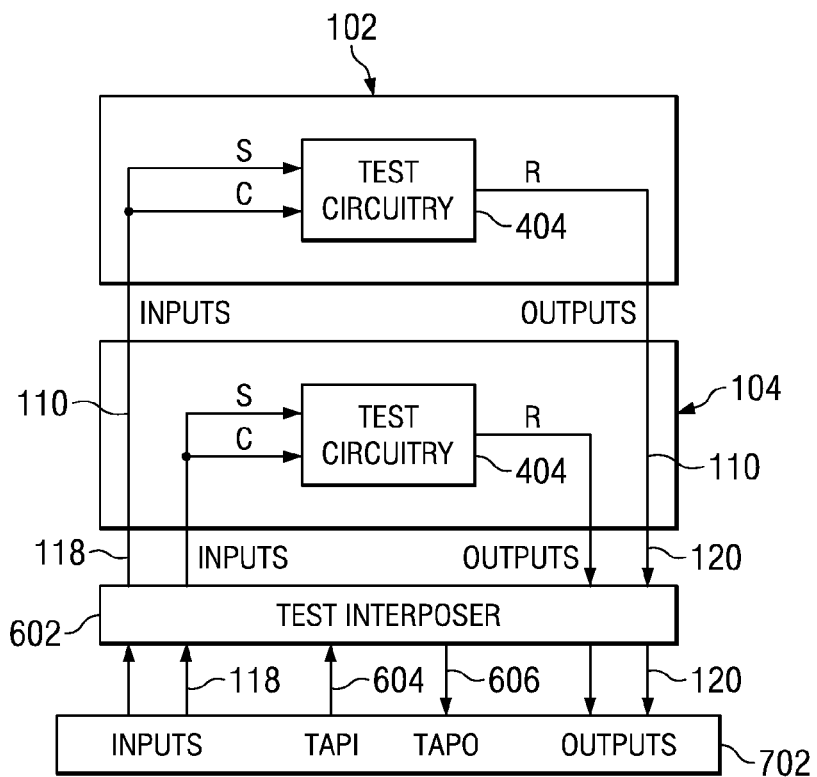
FIG. 7 illustrates an alternate view of FIG. 6.

FIG. 7 illustrates the die stack of FIG. 5 with the conventional interposer 106 being replaced with the test interposer 602 of the present disclosure. The test interposer 602 is similar to the conventional interposer 106 of FIG. 3 in that in test mode it can pass test stimulus and control inputs 118 from a tester 702 to the test circuitry 404 and pass test response outputs 120 from the test circuitry 404 to the tester 702.

The test interposer 602 of FIGS. 6 and 7 differs from the conventional interposer 106 of FIGS. 3 and 5 in that it has additional inputs for inputting 1149.1 TAP input signals (TAPI) from the substrate 608 or tester 702 and an additional output for outputting an 1149.1 TAP output signal (TAPO) 606 to the substrate 608 or tester 702. The 1149.1 TAP can be accessed via TAPI and TAPO to enable test circuitry embedded within test interposer 602 to test the die, as described below.

Figure 8:
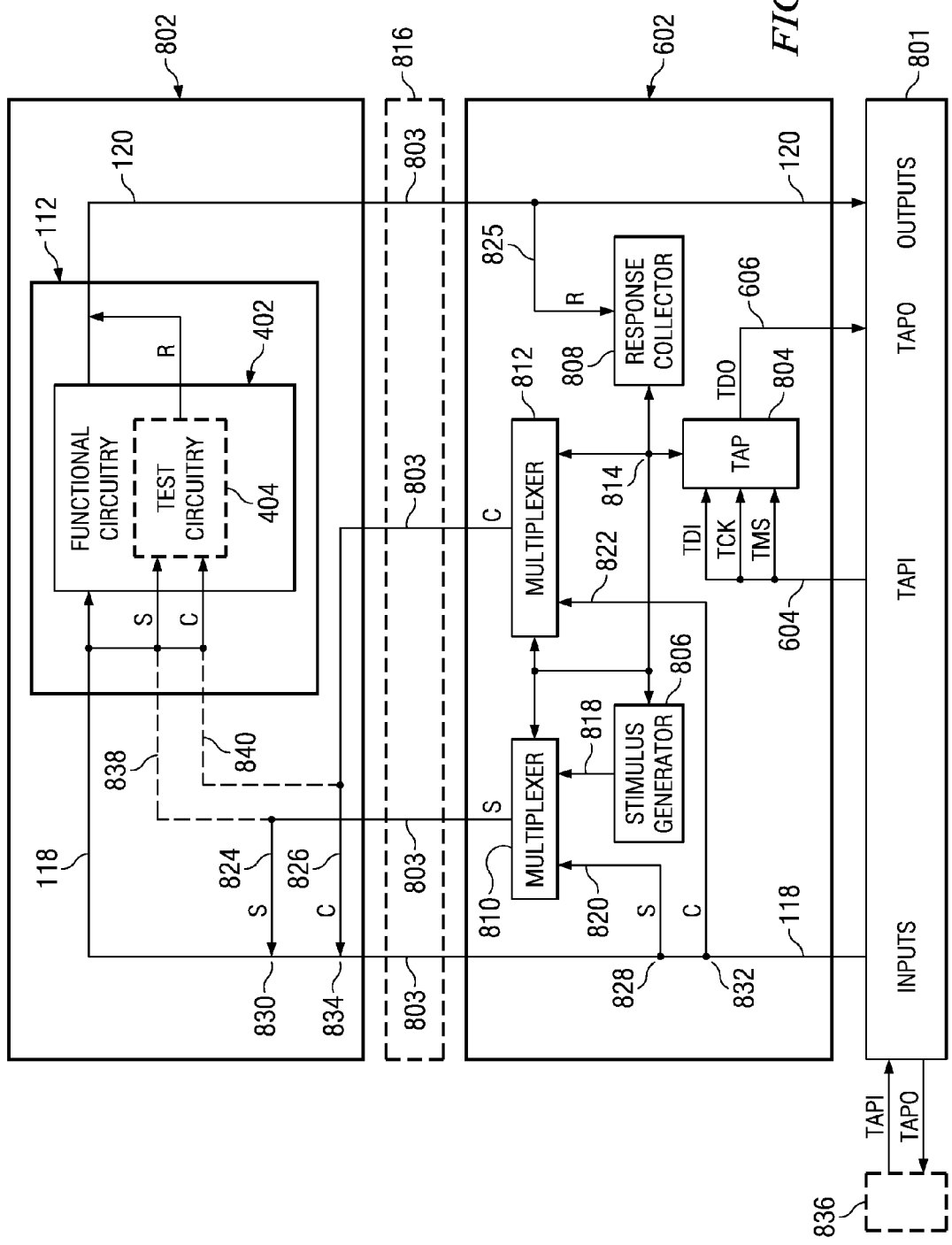
FIG. 8 illustrates a first view of the test interposer of the disclosure.

FIG. 8 illustrates a first example embodiment of a test interposer 602 of the present disclosure shown coupled between a tester or substrate 801 and a die 802. Die 802 may be directly coupled to the test interposer 602 or it may be coupled to the test interposer via TSVs 803 of one or more intermediate dies 816 in a die stack. Test interposer 602 includes an 1149.1 TAP 804, a stimulus generator circuit 806, a response collector circuit 808, multiplexer 810 and multiplexer 812. The TAP has inputs for a TDI, TCK and TMS signal from TAPI 604 of tester or substrate 801 and outputs for a control bus 814 and a TDO signal to TAPO 606 of tester or substrate 702. The stimulus generator 806 has inputs coupled to the TAP control bus 814 and stimulus outputs 818 coupled to multiplexer 810. The response collector has inputs coupled to the TAP control bus 814 and to response outputs 825 on bus 120 from test circuitry 404 of die 802. Multiplexer 810 has first inputs coupled to the stimulus outputs 818 of stimulus generator 806, second inputs coupled to stimulus inputs 820 on bus 118 from tester or substrate 801, a control input coupled to TAP control bus 814 and outputs coupled to stimulus inputs 824 on bus 118 to test circuitry 404 of die 802. Multiplexer 812 has first inputs coupled to the TAP control bus 814, second inputs coupled to control inputs 822 on bus 118 from tester or substrate 801 and outputs coupled to control inputs 826 on bus 118 to test circuitry 404 of die 802.

The stimulus input signals 820 on bus 118 are removed from bus 118 at point 828 and are replaced onto bus 118 at point 830 via output bus 824 of multiplexer 810. The stimulus input signals 824 that are replaced onto bus 118 at point 830 may, by control of multiplexer 810, come from bus 820 of bus 118 or from bus 818 from stimulus generator 810.

The control input signals 822 on bus 118 are removed from bus 118 at point 832 and are replaced onto bus 118 at point 834 via output bus 812 of multiplexer 812. The control input signals 826 that are replaced onto bus 118 at point 834 may, by control of multiplexer 812, come from bus 822 of bus 118 or from control bus 814 of TAP 804.

The stimulus and control input signals of bus 118 may be dedicated test input signals to test circuitry 404 or they may be shared between being used as test input signals to test circuitry 404 and functional input signals to functional circuitry 402. Likewise, the response output signals of bus 120 may be dedicated test output signals from test circuitry 404 or they may be shared between being used as test output signals from test circuitry 404 and functional output signals from functional circuitry 402.

The advantage of sharing the stimulus, control and response signals is that it reduces the number of TSVs that must be implemented in each die of the die stack, which also reduces the number of connection points 116 between the die in the die stack, each of which requires continuity testing.

If the stimulus 824 and control 826 bus signals are dedicated, they will be connected directly to the stimulus and control bus signal inputs of test circuitry 404 as shown in dotted lines 838 and 840, instead of being replaced onto bus 118 at points 830 and 834.

Functional Operation Mode:

During functional operation when the test interposer 602 is mounted on a system substrate 801, the test interposer 602 is controlled by TAP 804 to allow the substrate 801 to input functional signals to die 802 via input bus 118 and receive functional output signals from die 802 via output bus 120. If the stimulus and control test input signals are shared as functional input signals to die 802, as mentioned above, multiplexer 810 will be controlled by TAP bus 814 to couple bus 820 to bus 824 and multiplexer 812 will be control by TAP bus 814 to couple bus 822 to bus 826 to provide functional inputs to die 802 on the shared signals. If the response test output signals 825 are shared as functional output signals from die 802, they will be output to substrate 801 via bus 120.

Test Operation Mode 1:

During test operation when the test interposer 602 is mounted on a system substrate 801, a TAP controller 836 connected to the substrate 801 can test die 802 by communicating to TAP 804 via the TAPI and TAPI signals. In response to the communication, TAP 804 outputs control on control bus 814 to couple the stimulus outputs of stimulus generator 806 to the stimulus inputs of test circuitry 404 via multiplexer 810 and couple the TAP control bus 814 to the control inputs of test circuitry 404 via multiplexer 812. Once the stimulus and control multiplexers are set, TAP 804 can be controlled by the TAP controller 836 to output control on bus 814 to; (1) operate the stimulus generator 806 to provide test stimulus data to test circuitry 404, (2) operate the response collector 808 to receive test response data from test circuitry 404 and (3) to control the test circuitry 404 to input the test stimulus data and output the test response data. At the end of test, TAP 804 can be controlled by the TAP controller 836 to control the response collector 808 to output the response test data collected during the test for inspection. Following the test, TAP 804 is controlled by the TAP controller 836 to place the test interposer 602 back into its functional mode to allow die 802 to resume functional input and output communication with substrate 801.

Test Operation Mode 2:

During test operation when the test interposer 602 is connected to a tester 801 and the test is to be performed by the tester providing the stimulus and control inputs via bus 118 and receiving the response outputs via bus 120, the multiplexers 810 and 812 are set to couple the tester provided stimulus and control signals on bus 118 to test circuitry 404 and the response signals from test circuitry 404 are output to the tester via bus 120. In this test operation mode, the test interposer 602 is set to operate like the conventional interposer 106 of FIG. 5 during test.

Test Operation Mode 3:

During test operation when the test interposer 602 is connected to a tester 801, and the test is to be performed by the tester operating TAP 804 via the TAPI and TAPO interface, multiplexers 810 and 812 are set by TAP bus 814 to couple the stimulus generator output bus 818 to the stimulus inputs of test circuitry 404 and the TAP control bus 814 to the control inputs of test circuitry 404. Once the stimulus and control multiplexers are set, TAP 804 is controlled by the tester 801 to output control on bus 814 to; (1) operate the stimulus generator 806 to provide test stimulus data to test circuitry 404, (2) operate the response collector 808 to receive test response data from test circuitry 404 and (3) to control the test circuitry 404 to input test stimulus data and output test response data. At the end of test, TAP 804 can be controlled by the tester 801 to control the response collector 808 to output the response test data collected during the test for inspection. Since this test only requires access to the test interposer's TAPI and TAPO interface, the tester 801 may simply be a TAP controller 836.

Figure 9:
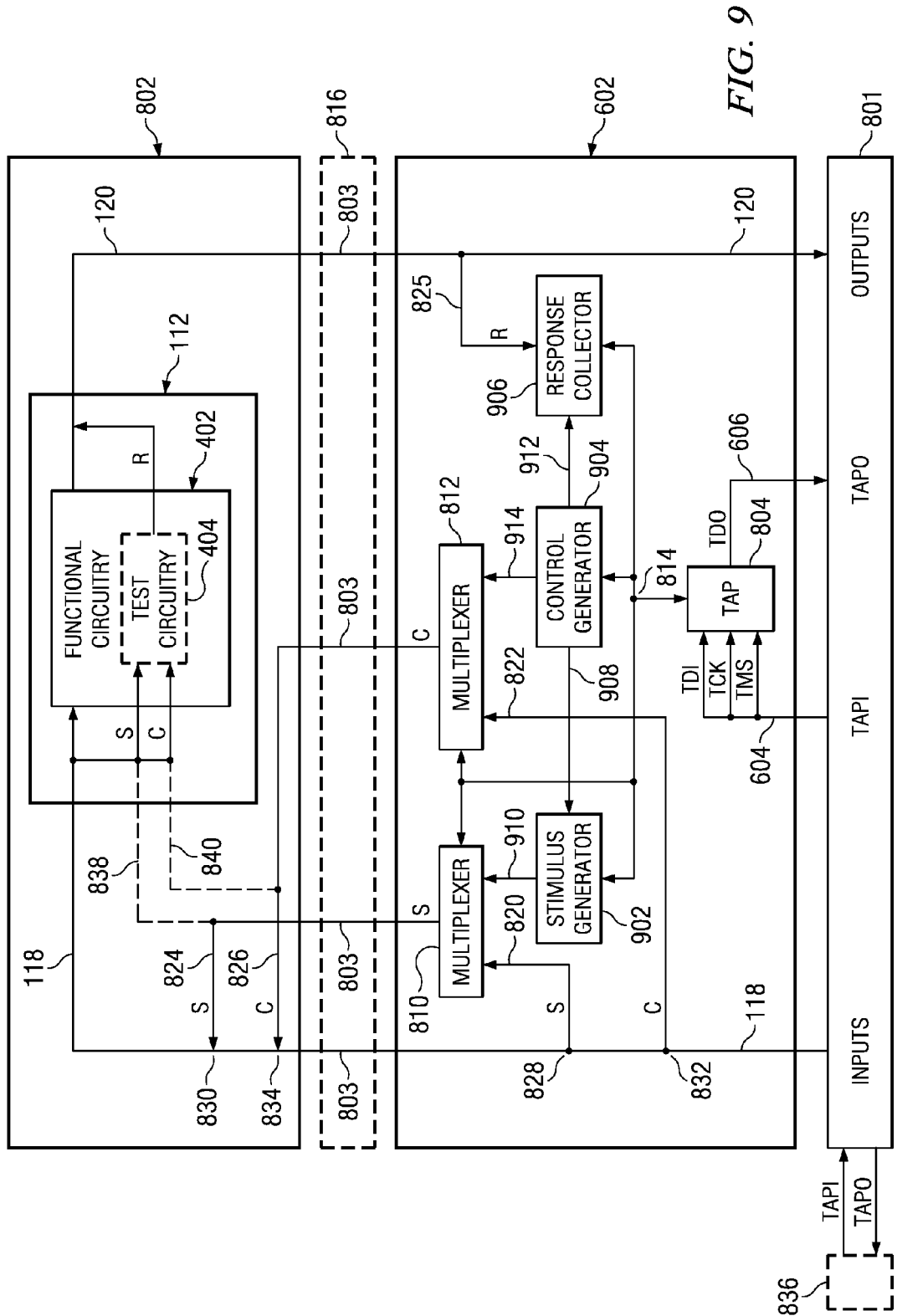
FIG. 9 illustrates a second view of the test interposer of the disclosure.

FIG. 9 illustrates a second example embodiment of a test interposer 602 of the present disclosure shown coupled between a tester or substrate 801 and a die 802. Die 802 may be directly coupled to the test interposer 602 or it may be coupled to the test interposer via TSVs 803 of one or more intermediate dies 816 in a die stack. Test interposer 602 includes an 1149.1 TAP 804, a stimulus generator circuit 902, a control generator circuit 904, a response collector circuit 906, multiplexer 810 and multiplexer 812. The TAP has inputs for a TDI, TCK and TMS signal from TAPI 604 of tester or substrate 801 and outputs for a control bus 814 and a TDO signal to TAPO 606 of tester or substrate 801. The stimulus generator 902 has inputs coupled to the TAP control bus 814, inputs coupled to control outputs 908 of the control generator 904 and stimulus outputs 910 coupled to multiplexer 810. The response collector 906 has inputs coupled to the TAP control bus 814, inputs coupled to control outputs 912 of the control generator 904 and inputs coupled to response outputs 825 on bus 120 from test circuitry 404 of die 802. The control generator 904 has inputs coupled to the TAP control bus 814, control outputs 908 coupled to stimulus generator 902, control outputs 912 coupled to response collector 906 and control outputs 914 coupled to inputs of multiplexer 812. Multiplexer 810 has first inputs coupled to the stimulus outputs 910 of stimulus generator 902, second inputs coupled to stimulus inputs 820 on bus 118 from tester or substrate 801, a control input coupled to TAP control bus 814 and outputs coupled to stimulus inputs 824 on bus 118 to test circuitry 404 of die 802. Multiplexer 812 has first inputs coupled to the control outputs 914 of control generator 904, second inputs coupled to control inputs 822 on bus 118 from tester or substrate 801 and outputs coupled to control inputs 826 on bus 118 to test circuitry 404 of die 802.

The stimulus input signals 820 on bus 118 are removed from bus 118 at point 828 and are replaced onto bus 118 at point 830 via output bus 824 of multiplexer 810. The stimulus input signals 824 that are replaced onto bus 118 at point 830 may, by control of multiplexer 810, come from bus 820 of bus 118 or from bus 910 from stimulus generator 902.

The control input signals 822 on bus 118 are removed from bus 118 at point 832 and are replaced onto bus 118 at point 834 via output bus 812 of multiplexer 812. The control input signals 826 that are replaced onto bus 118 at point 834 may, by control of multiplexer 812, come from bus 822 of bus 118 or from control bus 914 of control generator 904.

The stimulus and control input signals of bus 118 may be dedicated test input signals to test circuitry 404 or they may be shared between being used as test input signals to test circuitry 404 and functional input signals to functional circuitry 402. Likewise, the response output signals of bus 120 may be dedicated test output signals from test circuitry 404 or they may be shared between being used as test output signals from test circuitry 404 and functional output signals from functional circuitry 402.

The advantage of sharing the stimulus, control and response signals is that it reduces the number of TSVs that must be implemented in each die of the die stack, which also reduces the number of connection points 116 between the die in the die stack, each of which requires continuity testing.

If the stimulus 824 and control 826 bus signals are dedicated, they will be connected directly to the stimulus and control bus signal inputs of test circuitry 404 as shown in dotted lines 838 and 840, instead of being replaced onto bus 118 at points 830 and 834.

Functional Operation Mode:

During functional operation when the test interposer 602 is mounted on a system substrate 801, the test interposer 602 is controlled by TAP 804 to allow the substrate 801 to input functional signals to die 802 via input bus 118 and receive functional output signals from die 802 via output bus 120. If the stimulus and control test input signals are shared as functional input signals to die 802, as mentioned above, multiplexer 810 will be controlled by TAP bus 814 to couple bus 820 to bus 824 and multiplexer 812 will be control by TAP bus 814 to couple bus 822 to bus 826 to provide functional inputs to die 802 on the shared signals. If the response test output signals 825 are shared as functional output signals from die 802, they will be output to substrate 801 via bus 120.

Test Operation Mode 1:

During test operation when the test interposer 602 is mounted on a system substrate 801, a TAP controller 836 connected to the substrate 801 can test die 802 by communicating to TAP 804 via the TAPI and TAPI signals. In response to the communication, TAP 804 outputs control on control bus 814 to couple the stimulus outputs of stimulus generator 902 to the stimulus inputs of test circuitry 404 via multiplexer 810 and couple the control generator 904 control bus 914 to the control inputs of test circuitry 404 via multiplexer 812. Once the stimulus and control multiplexers are set, TAP 804 can be controlled by the TAP controller 836 to output control on bus 814 to enable the control generator 904. When control generator 904 is enabled, it; (1) outputs control on bus 908 to operate the stimulus generator 902 to provide test stimulus data to test circuitry 404, (2) outputs control on bus 912 to operate the response collector 908 to receive test response data from test circuitry 404 and (3) outputs control on bus 914 to operate the test circuitry 404 to input the test stimulus data and output the test response data. At the end of test, TAP 804 can be controlled by the TAP controller 836 to control the response collector 908 to output the response test data collected during the test for inspection. Following the test, TAP 804 is controlled by the TAP controller 836 to place the test interposer 602 back into its functional mode to allow die 802 to resume functional input and output communication with substrate 801.

Test Operation Mode 2:

During test operation when the test interposer 602 is connected to a tester 801 and the test is to be performed by the tester providing the stimulus and control inputs via bus 118 and receiving the response outputs via bus 120, the multiplexers 810 and 812 are set to couple the tester provided stimulus and control signals on bus 118 to test circuitry 404 and the response signals from test circuitry 404 are output to the tester via bus 120. In this test operation mode, the test interposer 602 is set to operate like the conventional interposer 106 of FIG. 5 during test.

Test Operation Mode 3:

During test operation when the test interposer 602 is connected to a tester 801, and the test is to be performed by the tester operating TAP 804 via the TAPI and TAPO interface, multiplexers 810 and 812 are set by TAP bus 814 to couple the stimulus generator output bus 910 to the stimulus inputs of test circuitry 404 and the control generator output bus 914 to the control inputs of test circuitry 404. Once the stimulus and control multiplexers are set, TAP 804 can be controlled by the TAP controller 836 to output control on bus 814 to enable the control generator 904. When control generator 904 is enabled, it; (1) outputs control on bus 908 to operate the stimulus generator 902 to provide test stimulus data to test circuitry 404, (2) outputs control on bus 912 to operate the response collector 908 to receive test response data from test circuitry 404 and (3) outputs control on bus 914 to operate the test circuitry 404 to input the test stimulus data and output the test response data. At the end of test, TAP 804 can be controlled by the tester 801 to control the response collector 808 to output the response test data collected during the test for inspection. Since this test only requires access to the test interposer's TAPI and TAPO interface, the tester 801 may simply be a TAP controller 836.

Figure 10:
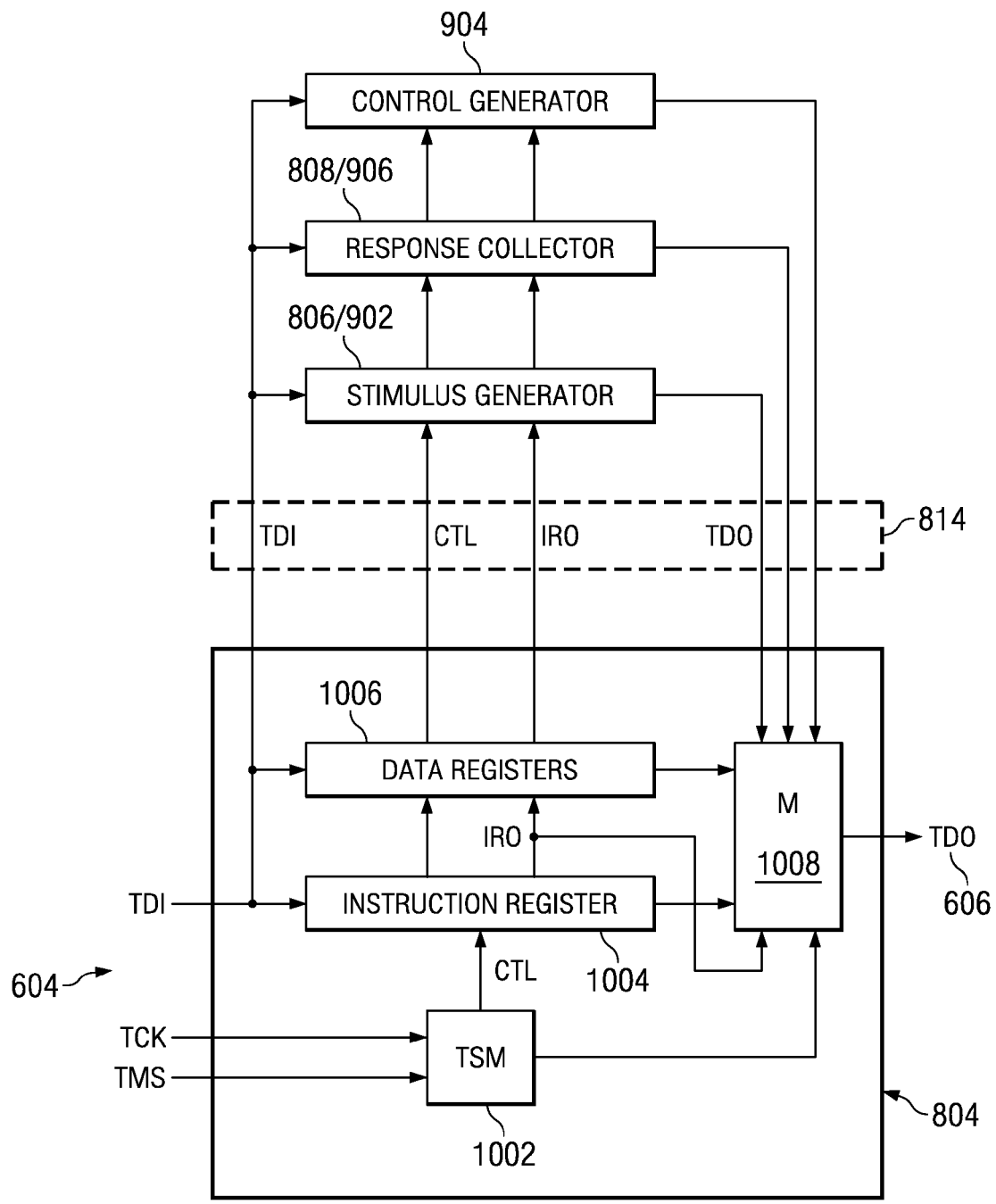
FIG. 10 illustrates the TAP of the test interposer.
Figure 11:
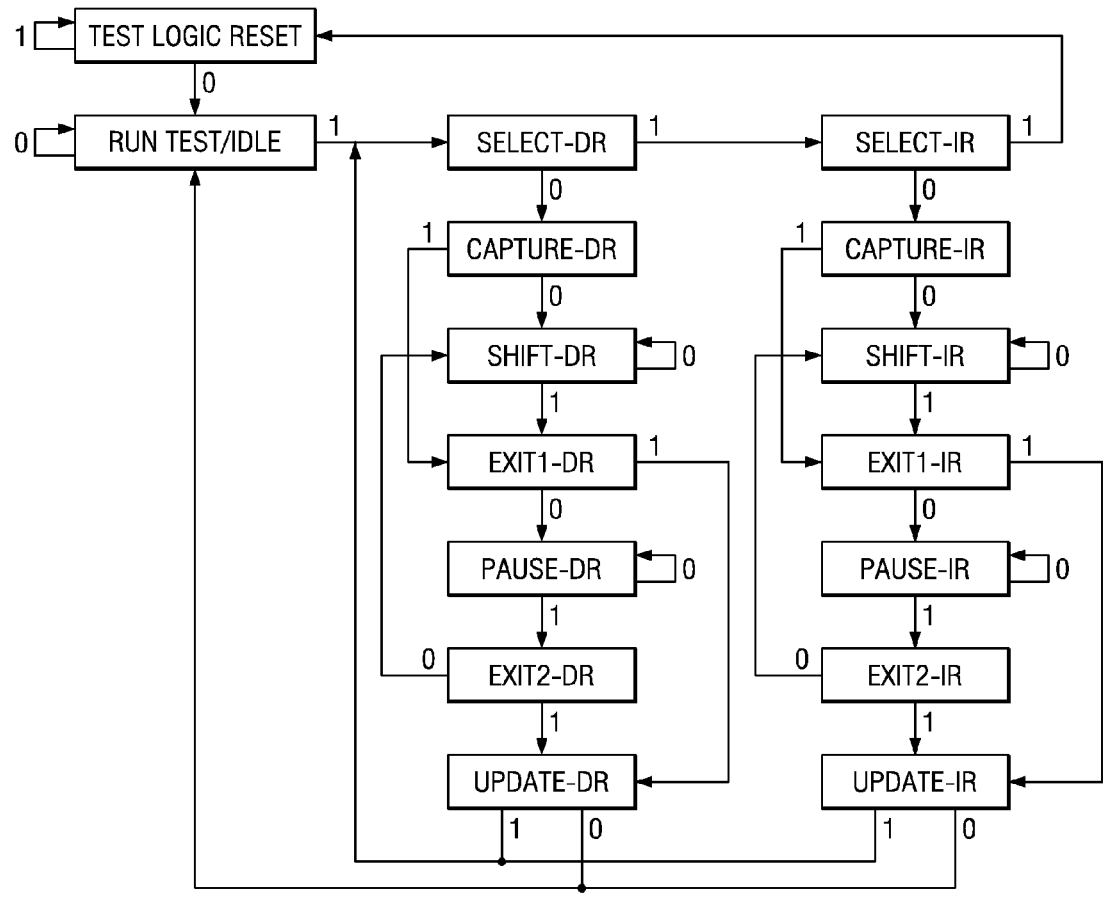
FIG. 11 illustrates the TAP state diagram.

FIG. 10 illustrates TAP 804 and its control bus 814 connections to control generator 904, response collector 808/906 and stimulus generator 806/902. The TAP is a well known test interface that operates according to the TAP state diagram of FIG. 11. The TAP includes a Tap State Machine (TSM) 1002, an instruction register 1004, data registers 1006 and a TDO output multiplexer 1008. In response to the TCK and TMS input of bus 604, the TSM may be in a reset state, a run test/idle state, data register scanning states or instruction register scanning states as seen in FIG. 11. During instruction register scanning states, the TSM outputs control (CTL) to scan an instruction into instruction register 1004 from TDI to TDO. During data register scanning states, the TSM outputs CTL to scan data into a data register 1006, selected by the instruction register output (IRO) bus of the instruction register, from TDI to TDO. As seen the TAP 804 interfaces with control generator, response collector and stimulus generator via the TDI, CTL, IRO and TDO signals of the control bus 814. When an instruction is loaded into the instruction register to select one of the control generator, response collector and stimulus generator, it can be scanned from TDI to TDO. Multiplexer 1008 is controlled by the IRO output bus to couple the TDO output of a selected data register, control generator, response collector or stimulus generator to the TDO 606 output of the TAP.

Scan Test Compression Example Using the Test Interposer

Figure 12:
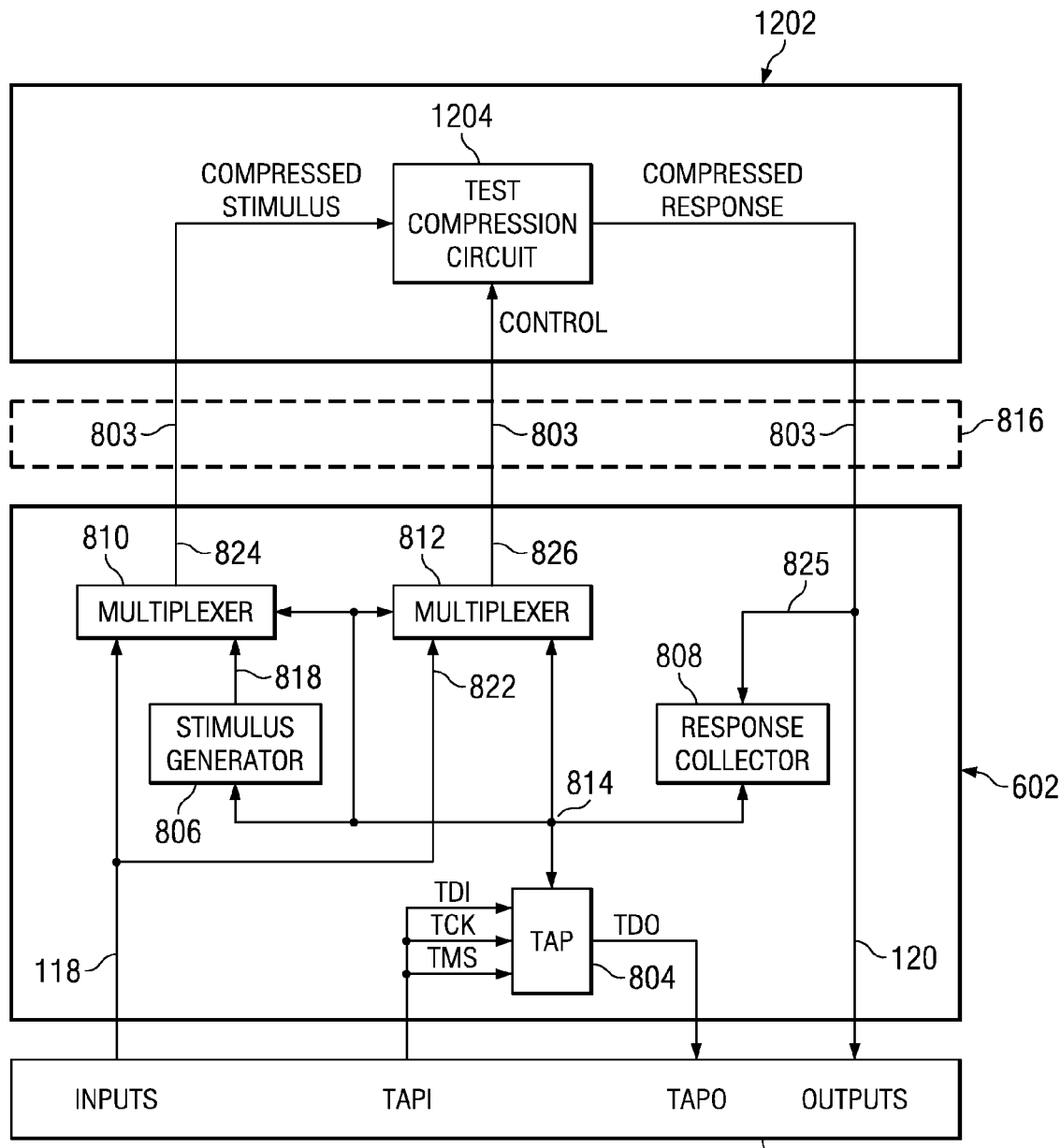
FIG. 12 illustrates a test interposer coupled to a test compression circuit of a die.

FIG. 12 illustrates a die 1202 containing a scan test compression circuit 1204 coupled to a tester 1206 via a test interposer 602 either directly or indirectly via TSVs 803 of intermediate die 816. Test compression circuits are well known and widely used in the industry. In response to control inputs, they input compressed stimulus data and output compacted response data.

If the test interposer 602 is set to allow the compressed stimulus and control inputs to be input from the tester 1206, multiplexers 810 and 812 will be controlled by the TAP 804 to couple compressed stimulus inputs from bus 118 to the compressed stimulus inputs of the test compression circuit and control inputs 822 from bus 118 to the control inputs of the test compression circuit. The compacted response is output to the tester on bus 120.

If the test interposer 602 is set to allow the compressed stimulus and control inputs to be input from the stimulus generator 806 and TAP control bus 814, respectively, multiplexers 810 and 812 will be controlled by the TAP 804 to couple compressed stimulus outputs 818 from stimulus generator 806 to the compressed stimulus inputs of the test compression circuit and the TAP control bus 814 to the control inputs of the test compression circuit. The compacted response is output to the response collector 808 via bus 825 from bus 120.

Figure 13:
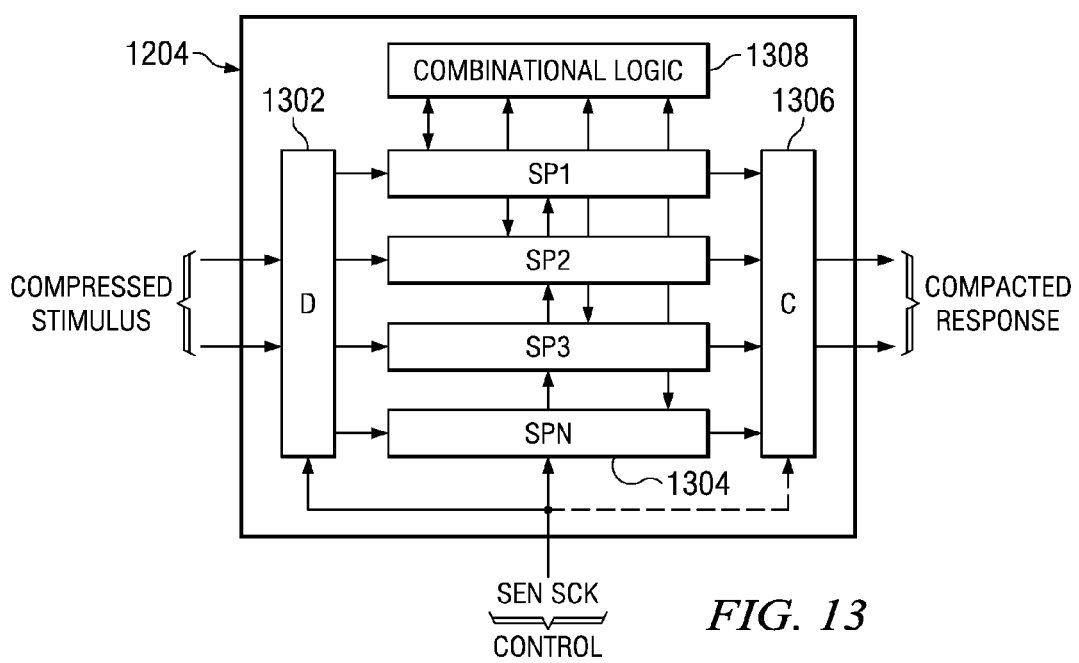
FIG. 13 illustrates the test compression circuit.

FIG. 13 illustrates an example test compression circuit which includes a decompressor 1302, scan paths 1304, compactor 1306 and combination logic 1308 to be tested. The decompressor 1302 inputs a small number of compressed stimulus data inputs and decompresses them into a large number scan inputs to the scan paths 1304. The compactor 1306 inputs a large number scan outputs from the scan paths 1304 and compacts them down to a smaller number of compacted response outputs. The scan paths 1304 outputs parallel stimulus to the combinational logic and receive parallel response from the combinational logic. The decompressor, the scan paths and optionally, as indicated in dotted line, the compactor operate in response to the control inputs, which in this example includes at least a scan enable (SEN) input and a scan clock (SCK) input.

Figure 14:
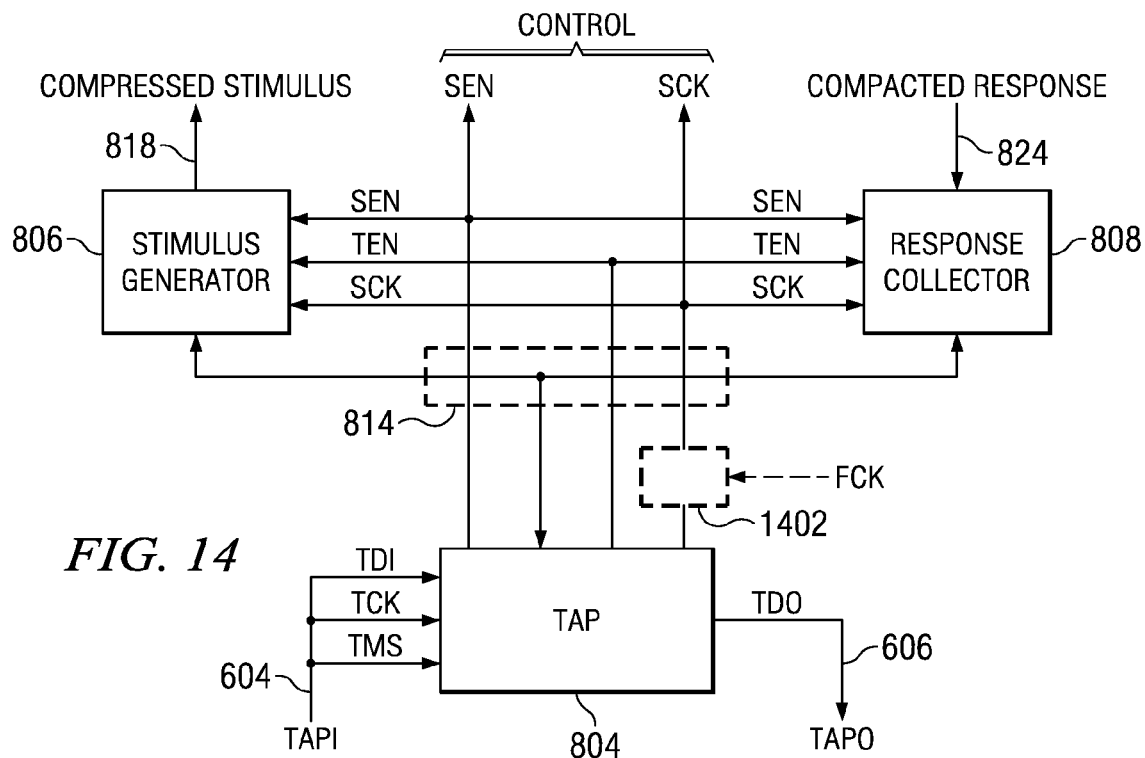
FIG. 14 illustrates the TAP controlling stimulus and response circuitry in the test interposer of FIG. 12.

FIG. 14 illustrates one example of how the TAP 804 may control the stimulus generator 806 that provides compressed stimulus data to a test compression circuit 1204 of FIG. 12 and the response collector 808 that receives compacted response data from the test compression circuit 1204 of FIG. 12. As seen the TAP control bus 814 of FIG. 10 is expanded to include a SEN, a test enable (TEN) and a SCK signal. The SEN, TEN and SCK signals are input to the stimulus generator 806 and the response compactor 808. The SEN and SCK signals are output to the test compression circuit of FIG. 13 via multiplexer 812 of FIG. 12. The SEN and SCK signals come from the TSM 1002 of FIG. 10 and the TEN signal comes from the IRO bus of the instruction register 1004 of FIG. 10. The TEN signal is set to enable the stimulus generator and response collector whenever the test compression circuit is selected for testing.

When the TAP is in the Capture-DR state of FIG. 11 the SEN signal is set (SEN=0) and a SCK is produced to cause the scan paths 1304 to capture response data from the combinational logic 1308. When the TAP is in the Shift-DR state of FIG. 11 the SEN signal is set (SEN=1) and SCKs are produced to cause the scan paths 1304 to shift data in and out. Also in the Shift-DR state, the stimulus generator outputs compressed stimulus to the test compression circuit and response collector inputs compacted response from the test compression circuit. In some implementations a "clock leaker" circuit 1402 may be optionally placed in the SCK signal path to allow a functional clock (FCK) to be leaked (i.e. gated) to the test compression circuit, stimulus generator and response collector in place of and in response to a produced SCK output from the TAP.

Figure 15:
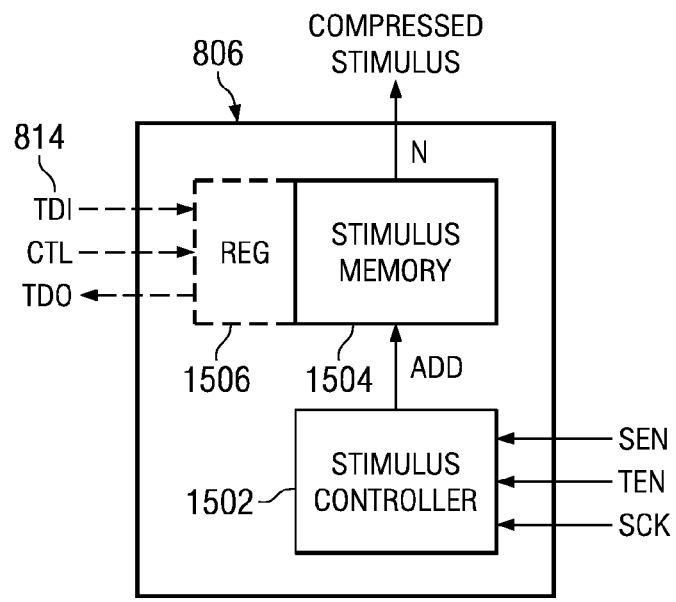
FIGS. 15-16 illustrate stimulus generator circuits of the disclosure.

FIG. 15 illustrates a first example implementation of a stimulus generator 806 for outputting compressed stimulus to a test compression circuit. The stimulus generator includes a stimulus controller 1502 and an N-bit wide stimulus memory 1504. The memory may be a ROM or a RAM. If it is a RAM memory a register 1506 will be provided on the memory to allow the TAP to write compressed stimulus data into the memory via control bus 814. When TEN is set and the TAP 804 is in the Shift-DR state (SEN=1), stimulus controller 1502 increments the memory address (ADD) during each SCK to output N-bit wide compressed stimulus to an N-bit wide test compression circuit. When TEN is set and the TAP 804 is not in the Shift-DR state (SEN=0) it ceases incrementing the memory address. In this example, the width (N) of the data bus output from the memory is designed to be equal to the width (N) of the compressed stimulus input to the test compression circuit.

Figure 16:
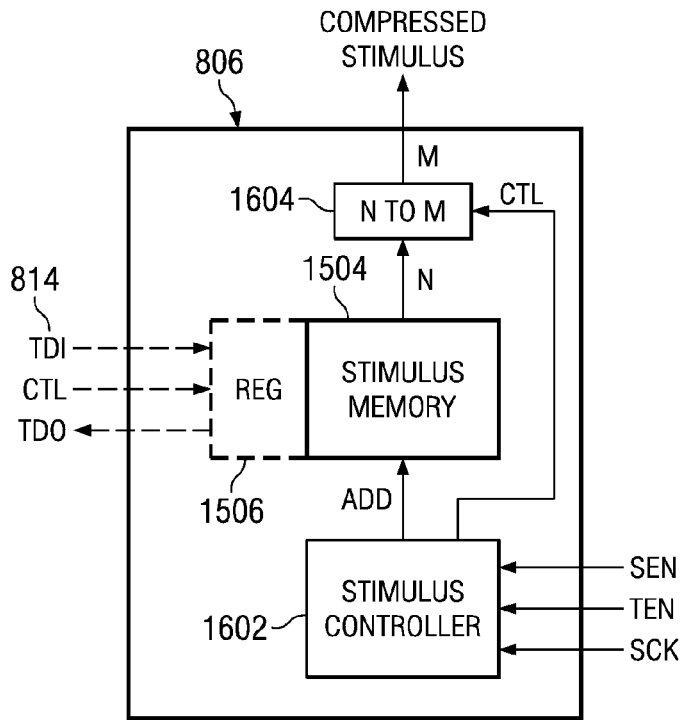

FIG. 16 illustrates a second example implementation of a stimulus generator 806 for outputting compressed stimulus to a test compression circuit. The stimulus generator includes a stimulus controller 1602, an N-bit wide stimulus memory 1504 which could be a ROM or RAM memory and an N to M bit width converter 1604. When TEN is set and the TAP 804 is in the Shift-DR state (SEN=1), stimulus controller 1602 outputs control (CTL) to cause the N to M converter to convert the wider N bit memory output bus to a narrower M bit bus that is input to the test compression circuit. After the N to M bit conversion is complete the stimulus controller increments the memory address to output the next N bit wide compressed stimulus pattern to the N to M converter. The stimulus controller is designed to perform the address increment operation such that it does not interrupt the M bit wide compressed stimulus output to the test compression circuit. When TEN is set and the TAP 804 is not in the Shift-DR state (SEN=0), the stimulus controller ceases controlling the N to M bit converter and incrementing the memory address. In this example, a larger N bit wide data bus output from the memory is adapted by the N to M bit converter to be equal to a smaller M bit wide input to a test compression circuit.

Figure 17:
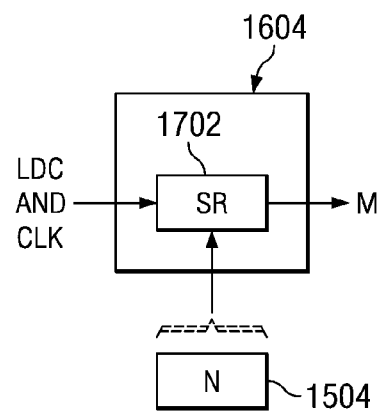
FIGS. 17-20 illustrate N to M conversion circuits of the disclosure.

FIG. 17 illustrates a first example of an N to M bit width converter 1604 which includes a shift register 1702. The shift register receives load control (LDC) input and clock (CLK) input from controller 1602. The CLK input is synchronized with the SCK when the TAP is in the Shift-DR state. The LDC input causes the shift register to load the N bit wide stimulus data from the stimulus memory 1504 and the CLK input causes the shift register to serially output the N bit wide stimulus data on a single M wide output to a single M wide input of a test compression circuit.

Figure 18:
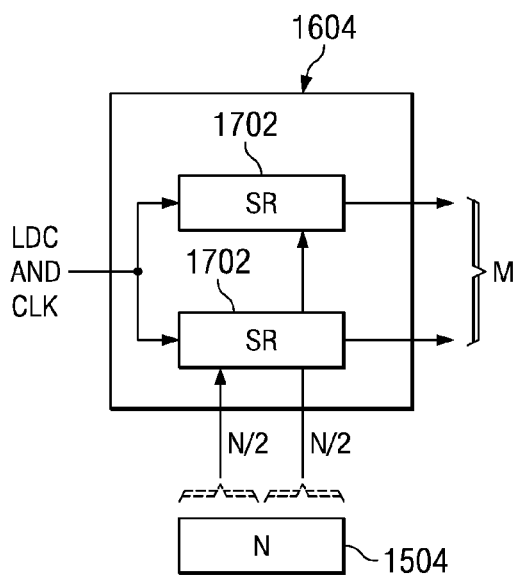

FIG. 18 illustrates a second example of an N to M bit width converter 1604 which includes, in this example, two shift registers 1702. The shift registers receive the LDC and CLK input from controller 1602. The CLK input is synchronized with the SCK when the TAP is in the Shift-DR state. The LDC input causes each of the shift registers to simultaneously load separate halves (N/2) of the N bit wide stimulus data from the stimulus memory 1504 and the CLK input causes the shift registers to serially output the separate N/2 halves on a pair of M outputs to a pair of M inputs of a test compression circuit. While this example shows two shift registers providing two M outputs, any number of shift registers and corresponding M outputs may be provided.

Figure 19:
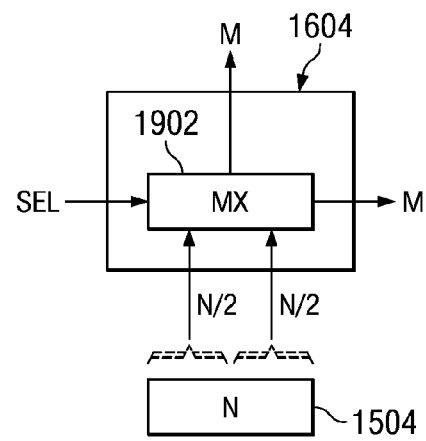

FIG. 19 illustrates a third example of an N to M bit width converter 1604 which includes a multiplexer 1902. The multiplexer receives select (SEL) input from controller 1602. The SEL input causes the multiplexer to alternate between outputting separate halves (N/2) of the N bit wide output from the stimulus memory 1504 to an M bit wide input to a test compression circuit, where M=N/2. While this example shows the multiplexer having two N/2 input busses that selectively drive the M output bus, the multiplexer could have any number of lesser width input busses (N/X) that selectively drive a correspondingly lesser width M output bus.

Figure 20:
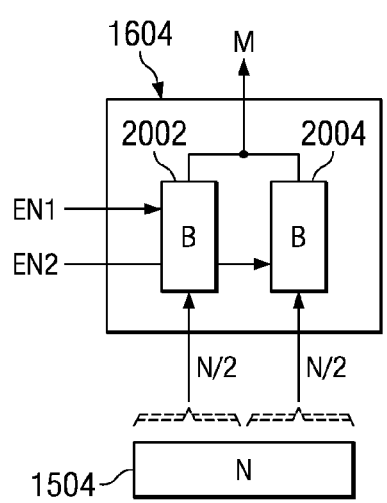

FIG. 20 illustrates a fourth example of an N to M bit width converter 1604 which includes tri-state buffers 2002 and 2004. Buffer 2002 receives a first enable (EN1) input from controller 1602 and buffer 2004 receives a second enable input (EN2) from controller 1602. When EN1 is active, buffer 2002 outputs a first half (N/2) of the N bit wide bus from memory 1504 to an M bit wide input to a test compression circuit. When EN2 is active, buffer 2004 outputs a second half (N/2) of the N bit wide bus from memory 1504 to the M bit wide input of the test compression circuit. While this example shows two buffers providing two separate N/2 wide sections of the N wide memory output bus to a correspondingly wide M output bus, any number of buffers could be used to provide any number of separate N/X wide sections of the N output bus to a correspondingly wide M output bus.

Figure 21:
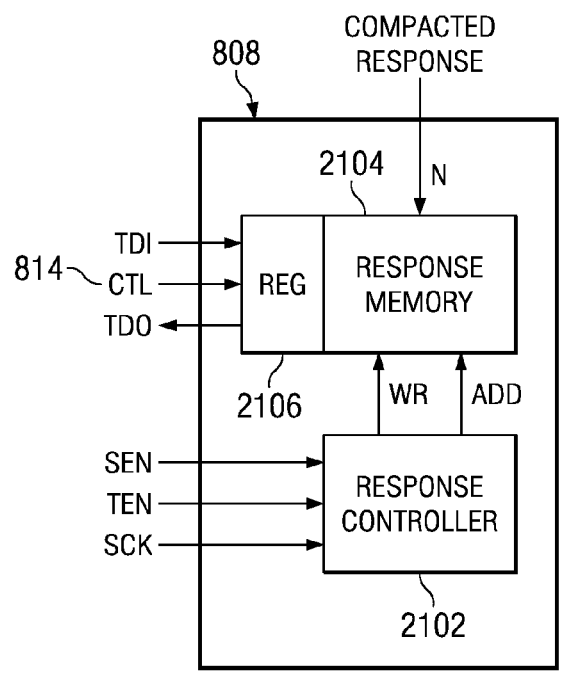
FIGS. 21-22 illustrate response collector circuits of the disclosure.

FIG. 21 illustrates a first example implementation of a response collector 808 for receiving compacted response from a test compression circuit. The response collector includes a response controller 2102 and an N-bit wide response memory 2104, such as a RAM memory. A register 2106 will be provided on the memory to allow the TAP to read out the compacted response stored in the memory after the test via control bus 814. When TEN is set and the TAP 804 is in the Shift-DR state (SEN=1), response controller 2102 outputs a write (WRT) signal to the memory to cause the memory to store compacted response data from a test compression circuit into the currently addressed memory location. Following the write operation, the response controller increments the memory address (ADD) to the next location to be written too. Each addressed memory location is written to during each SCK while the TAP is in the Shift-DR state. When the TAP 804 is not in the Shift-DR state (SEN=0), the response controller ceases the write and address incrementing operations. In this example, the width (N) of data bus input to the memory is designed to be equal to the width (N) of the compacted response output from the test compression circuit.

Figure 22:
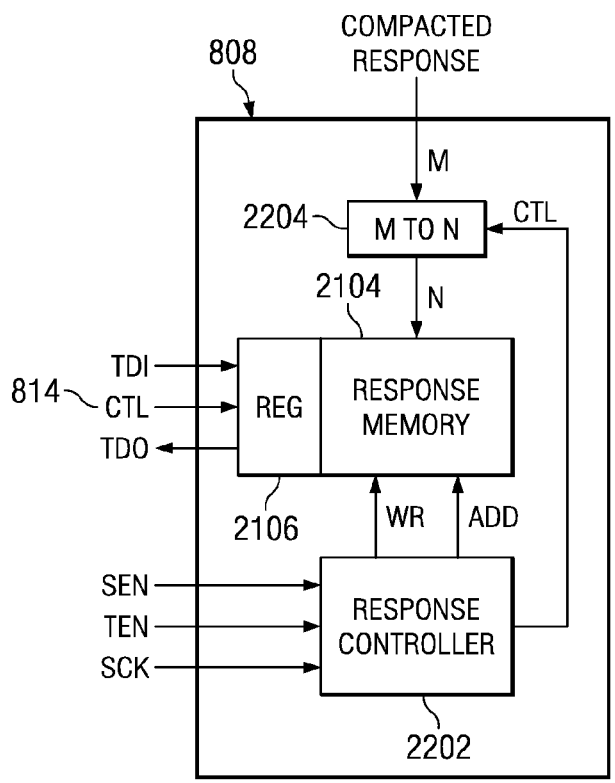

FIG. 22 illustrates a second example implementation of a response collector 808 for receiving compacted response from a test compression circuit. The response collector includes a response controller 2202, an N-bit wide response memory 2104 and an M to N bit width converter 2204. When TEN is set and the TAP 804 is in the Shift-DR state (SEN=1), response controller 2202 outputs control (CTL) to cause the M to N converter to convert the smaller M-bit wide output bus from the test compression circuit to the wider N-bit wide input bus to the memory. After the M to N conversion is complete the response controller outputs a write (WRT) signal to store the N-bit wide response pattern in the currently addressed memory location, then increments the memory address (ADD) to the next location to be written to. The response controller is designed to perform the memory write and address increment operations such that it does not interrupt the M to N bit conversion operation of the M to N bit converter. When TEN is set and the TAP 804 is not in the Shift-DR state (SEN=0), the response controller ceases controlling the M to N bit converter and ceases the write and address incrementing operations. In this example, the larger N bit wide data bus input to the memory is adapted by the M to N bit converter to receive the smaller M bit wide output from a test compression circuit.

Figure 23:
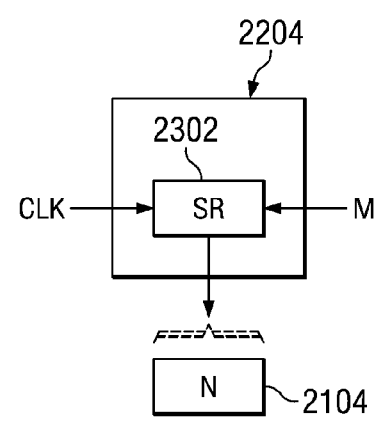
FIGS. 23-24 illustrate M to N conversion circuits of the disclosure.

FIG. 23 illustrates a first example of an M to N bit width converter 2204 which includes a shift register 2302. The shift register receives the CLK input from controller 1602. The CLK input is synchronized with the SCK when TEN is set and the TAP is in the Shift-DR state (SEN=1). The CLK input causes the shift register to input a single compacted response input (M) from a single compacted response output (M) of a test compression circuit. When the shift register fills, the response controller outputs a write (WRT) signal to cause memory 2104 to load the parallel output of the shift register into the currently addressed memory location. Following the write operation, the response controller increments the memory address (ADD). This serial input and parallel output operation repeats while the TAP is in the Shift-DR state. When the TAP 804 exits the Shift-DR state it ceases the serial input and parallel write operations.

Figure 24:
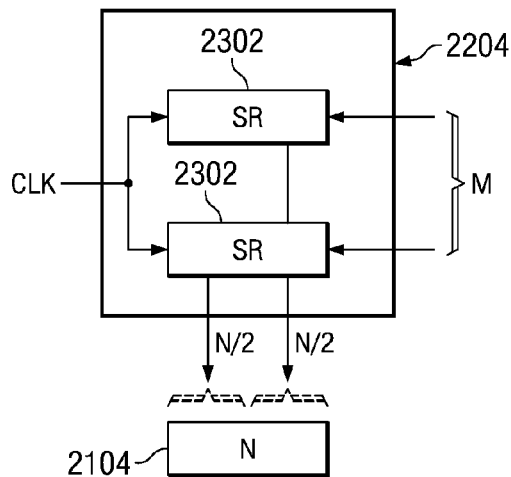

FIG. 24 illustrates a second example of an M to N bit width converter 2204 which includes a pair of shift registers 2302. The shift registers receive the CLK input from controller 1602. The CLK input is synchronized with the SCK when TEN is set and the TAP is in the Shift-DR state (SEN=1). The CLK input causes the shift registers to input a pair of compacted response inputs (M) from a pair of compacted response outputs (M) of a test compression circuit. When the shift registers fill, the response controller outputs a write (WRT) signal to cause memory 2104 to load the parallel outputs of the shift registers into the currently addressed memory location. Following the write operation, the response controller increments the memory address (ADD). This serial input and parallel output operation repeats while the TAP is in the Shift-DR state. When the TAP 804 exits the Shift-DR state it ceases the serial input and parallel write operations. While this example shows two shift registers providing inputs from two M outputs of a test compression circuit to two N/2 inputs of the memory, any number of shift registers (X) may be employed to support a corresponding number of inputs (X) from a test compression circuit. Each shift register would provide an N/X wide input bus to the N wide input bus of memory 2104.

Figure 25:
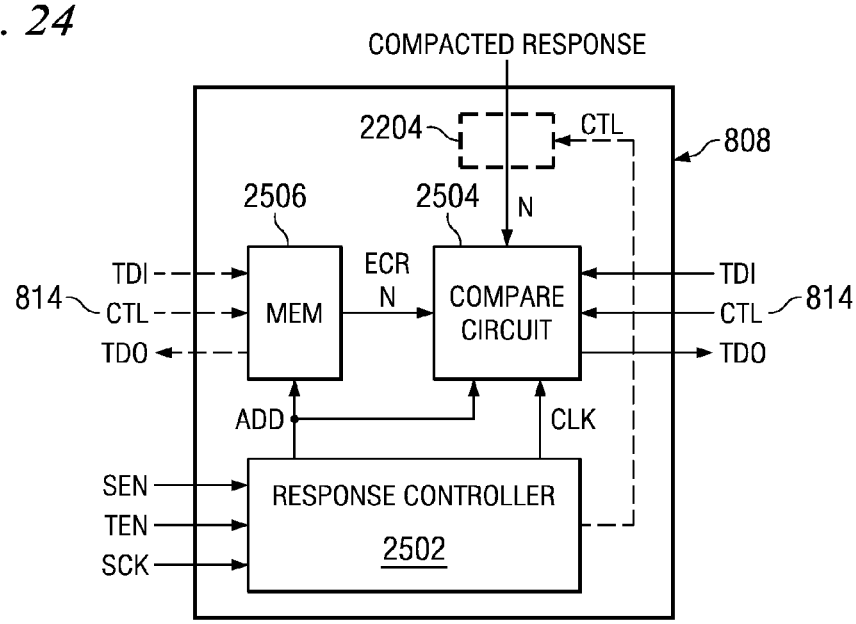
FIG. 25 illustrates a response collector circuit of the disclosure.

FIG. 25 illustrates a third example implementation of a response collector 808 for receiving N-bit wide compacted response from a test compression circuit. The response collector includes a response controller 2502, a compare circuit 2504 and memory 2506 for storing N-bit wide expected compacted response (ECR) data. The memory could be a ROM or RAM. If it is a RAM, it will be interfaced to TAP 804 via control bus 814 to allow loading the ECR data as described in regard to memory 1504 of FIG. 15. When TEN is set and the TAP 804 is in the Shift-DR state (SEN=1), response controller 2502 outputs a clock (CLK) signal to the compare circuit to cause the compare circuit to compare the compacted response output from a test compression circuit against the ECR output from a currently addressed location in memory 2506. The CLK signal is synchronized with the SCK signal. Following the compare operation, the response controller increments the memory address (ADD) to output the next ECR data to the compare circuit. The ADD output from response controller 2502 is also input to compare circuit 2504 to allow storing the ECR address where a comparison failure occurs. This CLK and ADD sequence repeats while the TAP is in the Shift-DR state. When the TAP 804 is not in the Shift-DR state (SEN=0), the response controller ceases producing the CLK and ADD signals. At the end of test, the compare circuit is accessed via control bus 814 to unload the results of the test which includes any failing bit(s) locations and the ECR address(s) where the failure(s) occurred. As seen in dotted line, an M to N converter 2204 may be used in response collector 808 and controlled (CTL) by the response controller 2502 as described in FIGS. 22-24.

Figure 26:
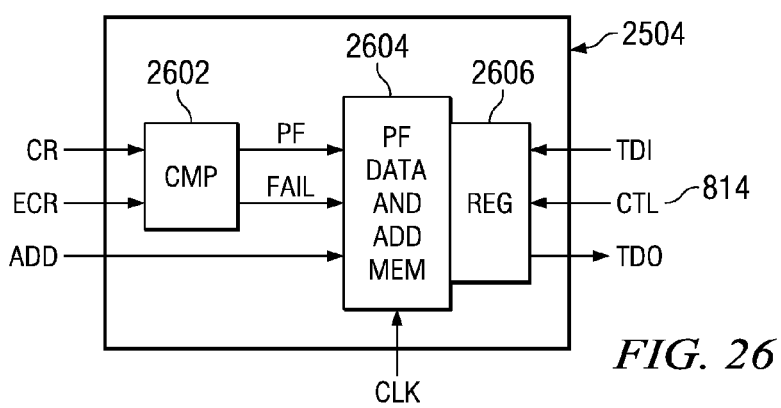
FIG. 26 illustrates a response compare circuit of the disclosure.

FIG. 26 illustrates an example implementation of compare circuit 2504 which includes a comparator 2602, pass/fail (PF) data and address memory 2604 and a register for allowing the memory 2604 to be accessed by the TAP 804 via bus 814. The comparator inputs the N-bit wide compacted response (CR) and ECR buses and outputs an N-bit wide PF bus and a fail signal. Memory 2604 inputs the PF bus, the fail signal and the ADD output from the response controller 2502. If the fail signal does not indicate a compare failure, memory 2604 does not respond to the CLK input. If the fail signal indicates a compare failure, memory 2604 responds to the CLK input to store the PF bus and the ADD from response controller 2502. Before the test starts the memory is initialized by the TAP via control bus 814. At the end of test, the contents of memory 2604 is read out via TAP control bus 814 to detect any failing PF bits and the address(es) where the failure(s) occurred.

FIG. 27 illustrates an example implementation of comparator 2602. The comparator includes and N XOR gates and an OR gate. Each of the N XOR gate inputs a unique one of the N CR and N ECR inputs and produces a unique PF output. The OR gate inputs the N PF outputs and outputs the fail signal. If any one or more of the N PF outputs indicate a compare failure (a high in this example), the OR gate outputs a fail signal to memory 2604.

FIG. 28 illustrates a fourth example implementation of a response collector 808 for receiving N-bit wide compacted response from a test compression circuit. The response collector includes an N-bit wide multiple input signature register (MISR). MISRs are LFSR based circuits that compress parallel inputs into a signature. The MISR is interfaced to control bus 814 to allow it to be accessed by the TAP 804. When TEN is set and the TAP 804 is in the Shift-DR state (SEN=1), MISR 2802 inputs and compresses the N-bit output from a test compression circuit during each SCK signal output from TAP 804. When the TAP 804 is not in the Shift-DR state (SEN=0), the MISR ceases inputting and compressing the N-bit output from the test compression circuit. At the end of test, the signature contained in the MISR is read out via control bus 814 from TAP 804.

FIG. 29 illustrates a first example of a die 1202 coupled either directly or indirectly, through TSVs 803 of intermediate die 816, to the test interposer 602 of FIG. 12. The test interposer 602 is connected to the TAPI and TAPO signals of a TAP controller 2904. In this example, multiplexer 810 is set to couple the outputs of stimulus generator 806 to the compressed stimulus inputs of a test compression circuit 1204 in die 1202, multiplexer 812 is set to couple the TAP control bus 814 to the control inputs of the test compression circuit 1204 and the compacted response outputs from test compression circuit 1204 are input to response collector 808. The stimulus generator 806 and response collector may be, but are not limited to being, any of the previously described stimulus generator 806 and response collector 808 circuits.

During test, the TAP controller 2904 operates the TAP 804 to input compressed stimulus to the test compression circuit from stimulus generator 806, input compacted response from the test compression circuit to response collector 808 and to control the operation of the test compression circuit via TAP control bus 814. At the end of test, the TAP controller 2904 accesses the response collector 808 via bus 814 to read out the test response results contained therein.

Figure 30:
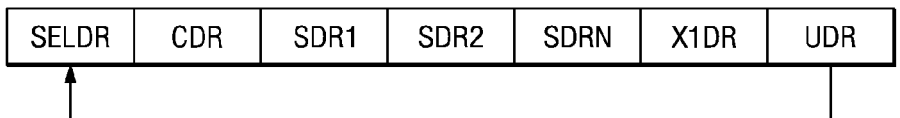
FIG. 30 illustrate the TAP state transitions during the test of FIG. 29.

FIG. 30 illustrates the state transitions (see FIG. 11) the TAP 804 loops 3002 through during the test. As seen the TAP loops through at least the Select-DR state (SELDR) to the Capture-DR state (CDR), from the CDR state to the Shift-DR state (SDR), from the SDR state to the Exit1-DR state (X1DR), from the X1DR state to the Update-DR state (UDR) and back to the SELDR state. This state transition loop repeats until the test is complete. In the CDR state, the scan paths 1304 of the test compression circuit are controlled to capture response data from combinational logic 1308 of FIG. 13. In the SDR state, the stimulus generator 806 is controlled to output compressed stimulus to the decompressor 1302 of the test compression circuit, the response collector 808 is controlled to input compacted response from compactor 1306 of the test compression circuit and the scan paths 1304 are controlled to shift data in from the decompressor and out to the compactor.

Figure 31:
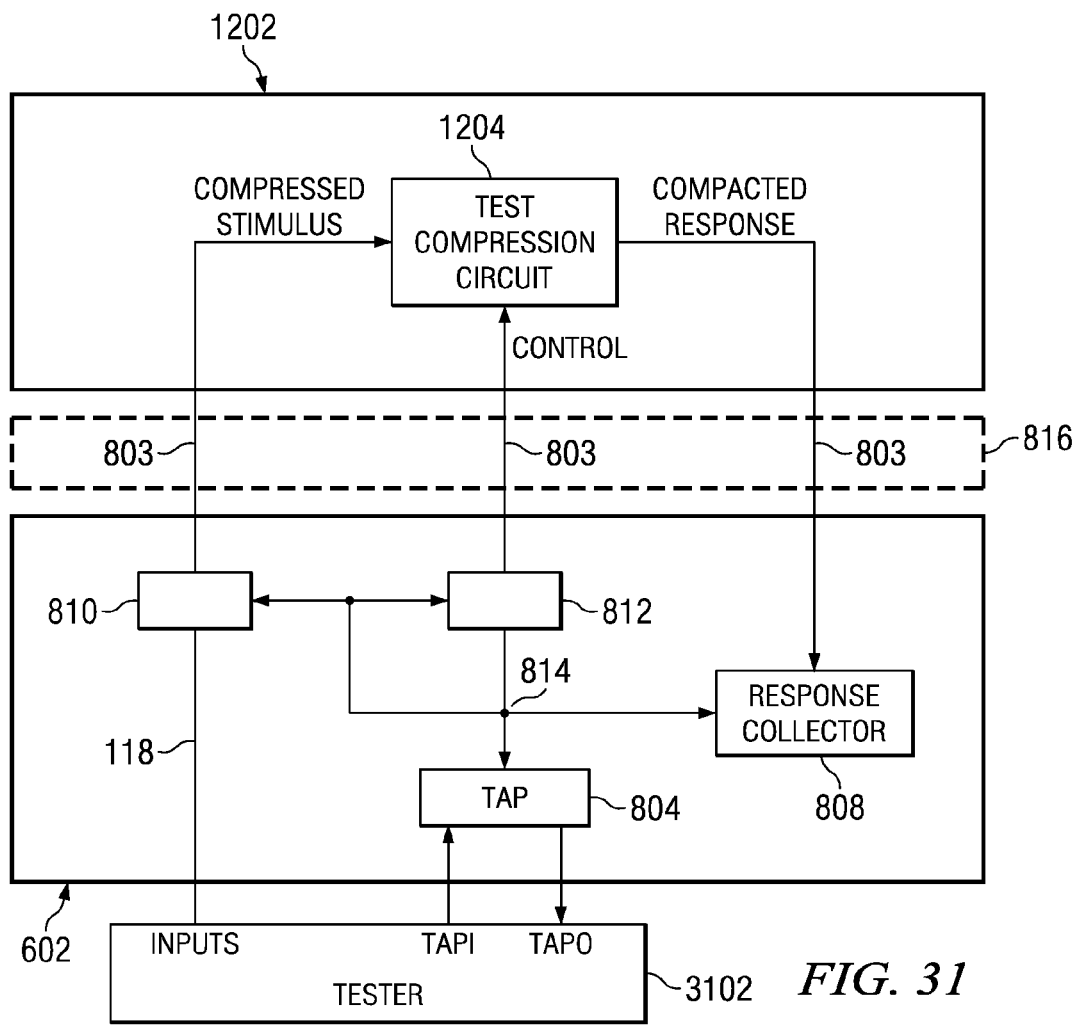
FIG. 31 illustrates a test compression circuit being tested by the test interposer and a tester.

FIG. 31 illustrates a second example of a die 1202 coupled either directly or indirectly through TSVs 803 of intermediate die 816, to a test interposer 602. The test interposer 602 is connected to a tester 3102 providing stimulus inputs 118 and TAPI and TAPO signals to the test interposer's TAP 804. In this example, multiplexer 810 is set to couple the stimulus inputs 118 from tester 3102 to the compressed stimulus inputs of a test compression circuit 1204 in die 1202, multiplexer 812 is set to couple the TAP control bus 814 to the control inputs of the test compression circuit 1204 and the compacted response outputs from test compression circuit 1204 are input to response collector 808. The response collector may be, but is not limited to being, any of the previously described response collector 808 circuits.

During test, the tester 3102 operates the TAP 804 to input compressed stimulus inputs 118 from tester 3102 to test the compression circuit, input compacted response from the test compression circuit to response collector 808 and to control the operation of the test compression circuit via TAP control bus 814. At the end of test, the tester 3102 accesses the response collector 808 via bus 814 to read out the test response results contained therein.

Figure 32:
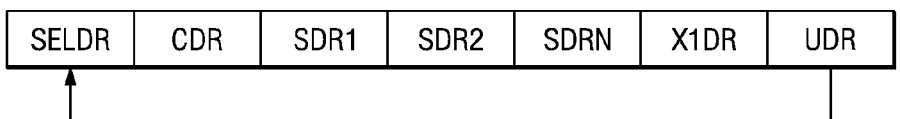
FIG. 32 illustrates the TAP state transitions during the test of FIG. 31.

FIG. 32 illustrates a state transition loop the TAP 804 may go through during the test. The state transition loop is the same as described in regard to FIGS. 29 and 30. In the CDR state, the scan paths 1304 of the test compression circuit are controlled to capture response data from combinational logic 1308 of FIG. 13. In the SDR state, the tester provides stimulus input 118 to the decompressor 1302 of the test compression circuit, the response collector 808 is controlled to input compacted response from compactor 1306 of the test compression circuit and the scan paths 1304 are controlled to shift data in from the decompressor and out to the compactor. As seen, this test method is similar to the test method of FIGS. 29 and 30, with the exception that the tester 3102 provides the compressed stimulus inputs to the test compression circuit instead of the stimulus generator 806.

Figure 33:
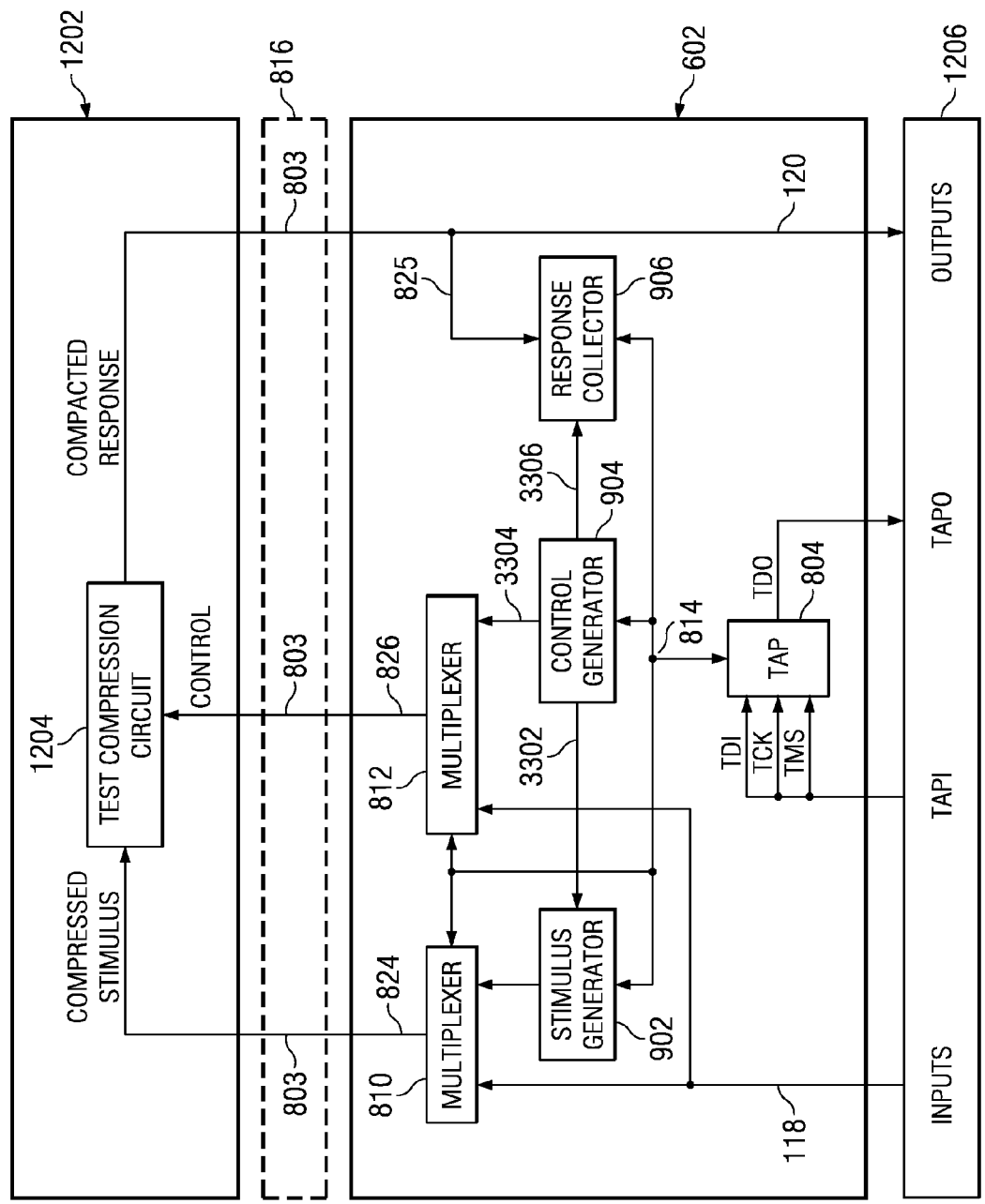
FIG. 33 illustrates a test interposer coupled to a test compression circuit of a die.

FIG. 33 illustrates a die 1202 containing a scan test compression circuit 1204 coupled to a tester 1206 via a test interposer 602 of FIG. 12, either directly or indirectly via TSVs of intermediate die 816. The test interposer includes a TAP 804, stimulus generator 902, control generator 904, response collector 906, multiplexer 810 and multiplexer 812. The control generator can be controlled by the TAP via bus 814 to output control signals 3302 to stimulus generator 902, control signals 3304 to multiplexer 812 and control signals 3306 to response collector 906.

If the test interposer 602 is set to allow the compressed stimulus and control inputs to be input from the tester 1206, multiplexers 810 and 812 will be controlled by TAP 804 to couple compressed stimulus inputs from bus 118 to the compressed stimulus inputs of the test compression circuit and control inputs from bus 118 to the control inputs of the test compression circuit. The compacted response is output to the tester on bus 120.

If the test interposer 602 is set to allow the compressed stimulus and control inputs to be input from the stimulus generator 902 and control generator 904, respectively, multiplexers 810 and 812 will be controlled by TAP 804 to couple the compressed stimulus outputs from stimulus generator 902 to the compressed stimulus inputs 824 of the test compression circuit and control outputs from the control generator 904 to the control inputs 826 of the test compression circuit. The compacted response output is input to the response collector 906 via bus 825 from bus 120.

Figure 34:
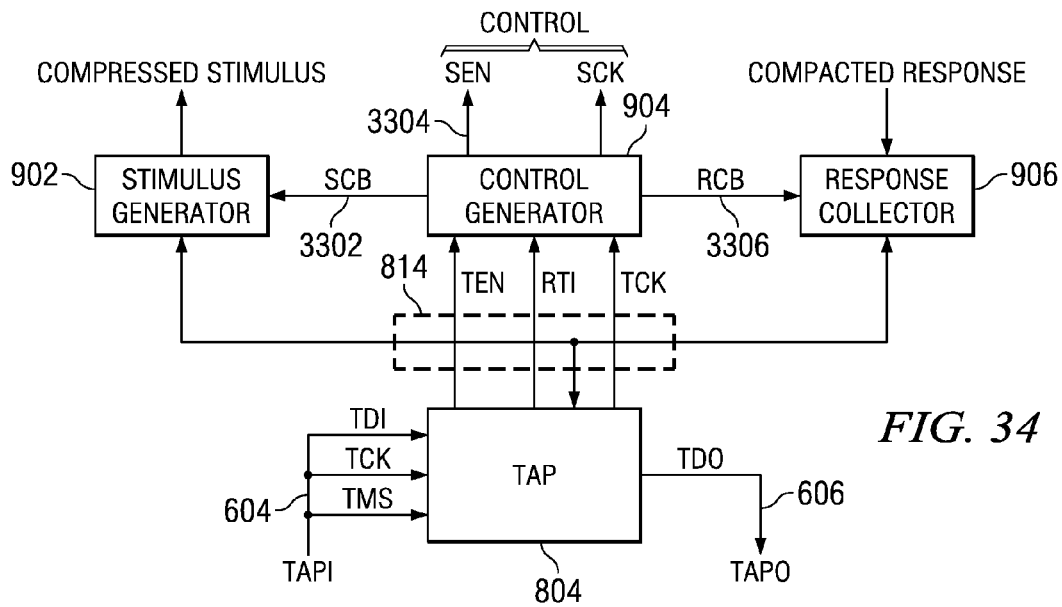
FIG. 34 illustrates the TAP controlling stimulus, control and response circuitry in the test interposer of FIG. 33.

FIG. 34 illustrates one example of how the TAP 804 may control the operation of control generator 904. As seen the TAP control bus 814 of FIG. 10 is expanded to include a TEN, a Run Test Idle (RTI), and a TCK signal. The RTI signal is output from the TAP 804 when the TSM 1002 of FIG. 10 is in the Run Test/Idle state of FIG. 11. The TEN signal comes from the IRO bus of the instruction register 1004 of FIG. 10. The TCK signal comes from TAPI bus 604.

To enable the control generator 904 the TAP is accessed via TAPI and TAPO to load an instruction into the TAP instruction register 1002, which sets the TEN signal. Next, the TAP is transitioned into the Run Test/Idle state of FIG. 11 which sets the RTI signal. When TEN and RTI are both set, the control generator responds to the TCK input to operate the output stimulus control bus (SCB) 3302 to stimulus generator 902, the SEN and SCK signals 3304 to multiplexer 812 and the response control bus (RCB) 3306 to response collector 906. In response to the SCB, the stimulus generator outputs compressed stimulus to the test compression circuit. In response to the RCB, the response collector inputs compacted response from the test compression circuit. In response to the SEN and SCK signals, the test compression circuit inputs the compressed stimulus and outputs compacted response when SEN is set (SEN=1) and captures response data from combinational logic when SEN is not set (SEN=0).

Figure 35:
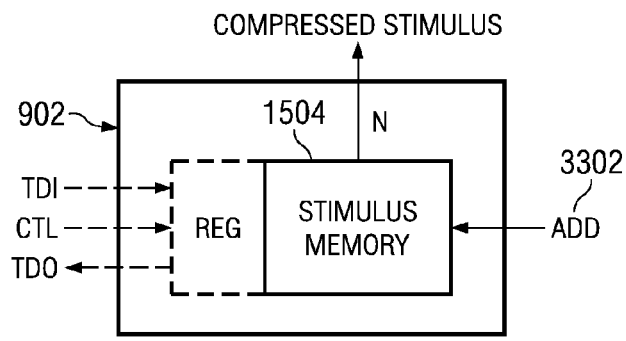
FIGS. 35-36 illustrate stimulus generator circuits of the disclosure.

FIG. 35 illustrates a first example implementation of a stimulus generator 902 for outputting compressed stimulus to a test compression circuit. The stimulus generator 902 operates as described in the stimulus generator 806 of FIG. 15. The only difference between the stimulus generator 806 of FIG. 15 and the stimulus generator 902 of FIG. 35 is that the ADD inputs come from control generator 904 via SCB 3302.

Figure 36:
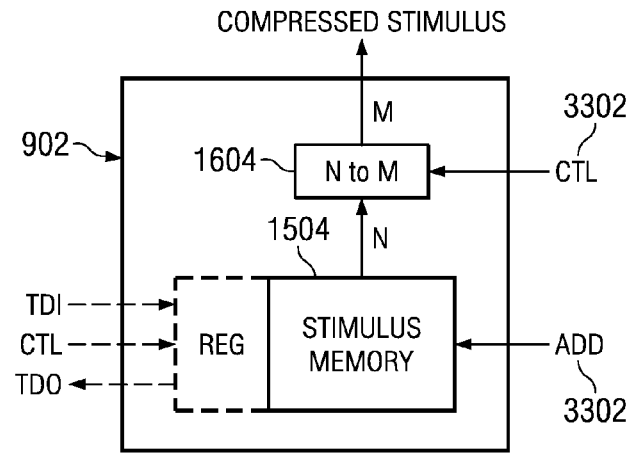

FIG. 36 illustrates a second example implementation of a stimulus generator 902 for outputting compressed stimulus to a test compression circuit. The stimulus generator 902 operates as described in the stimulus generator 806 of FIG. 16. The only difference between the stimulus generator 806 of FIG. 16 and the stimulus generator 902 of FIG. 36 is that the ADD and CTL inputs come from control generator 904 via SCB 3302.

Figure 37:
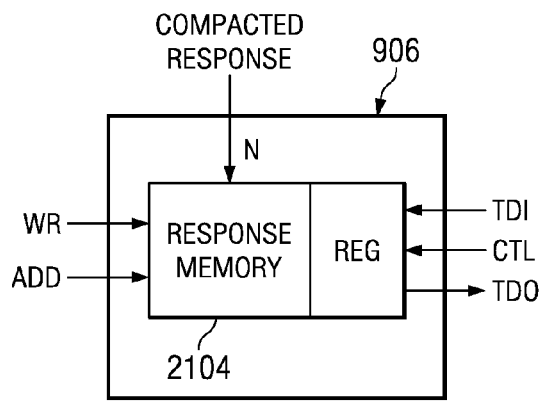
FIGS. 37-40 illustrate response collector circuits of the disclosure.

FIG. 37 illustrates a first example implementation of a response collector 906 for inputting compacted response from a test compression circuit. The response collector 906 operates as described in the response collector 808 of FIG. 21. The only difference between the response collector 808 of FIG. 21 and the response collector 906 of FIG. 37 is that the ADD and WR inputs come from control generator 904 via RCB 3306.

Figure 38:
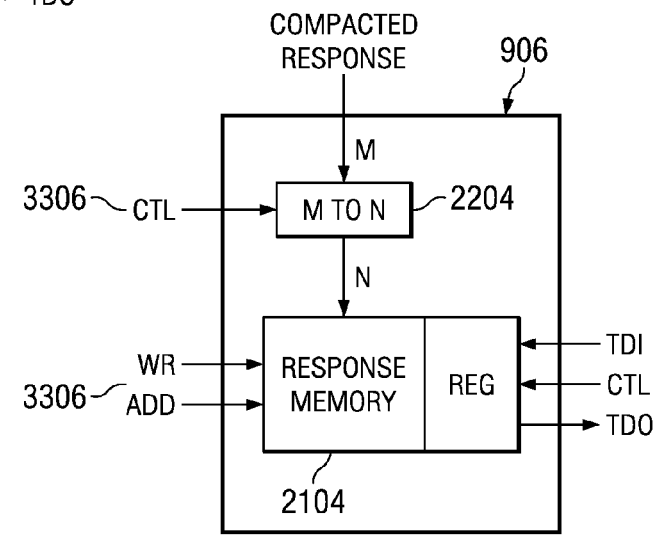

FIG. 38 illustrates a second example implementation of a response collector 906 for inputting compacted response from a test compression circuit. The response collector 906 operates as described in the response collector 808 of FIG. 22. The only difference between the response collector 808 of FIG. 22 and the response collector 906 of FIG. 38 is that the ADD and WR inputs come from control generator 904 via RCB 3306.

Figure 39:
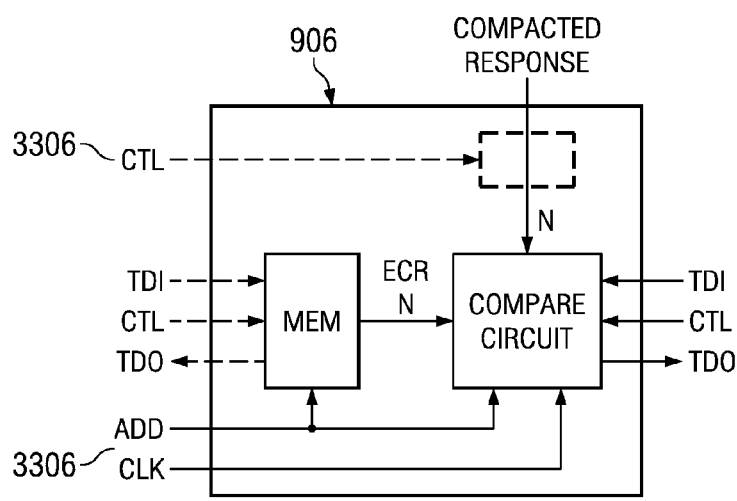

FIG. 39 illustrates a third example implementation of a response collector 906 for inputting compacted response from a test compression circuit. The response collector 906 operates as described in the response collector 808 of FIG. 25. The only difference between the response collector 808 of FIG. 25 and the response collector 906 of FIG. 39 is that the ADD, CLK and CTL inputs come from control generator 904 via RCB 3306.

Figure 40:
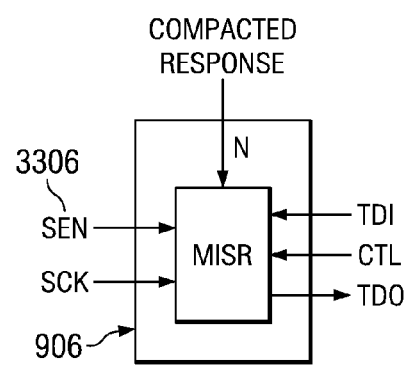

FIG. 40 illustrates a fourth example implementation of a response collector 906 for inputting compacted response from a test compression circuit. The response collector 906 operates as described in the response collector 808 of FIG. 28. The only difference between the response collector 808 of FIG. 28 and the response collector 906 of FIG. 40 is that the TEN input is not required and the SEN and SCK inputs come from control generator 904 via RCB 3306.

Figure 41:
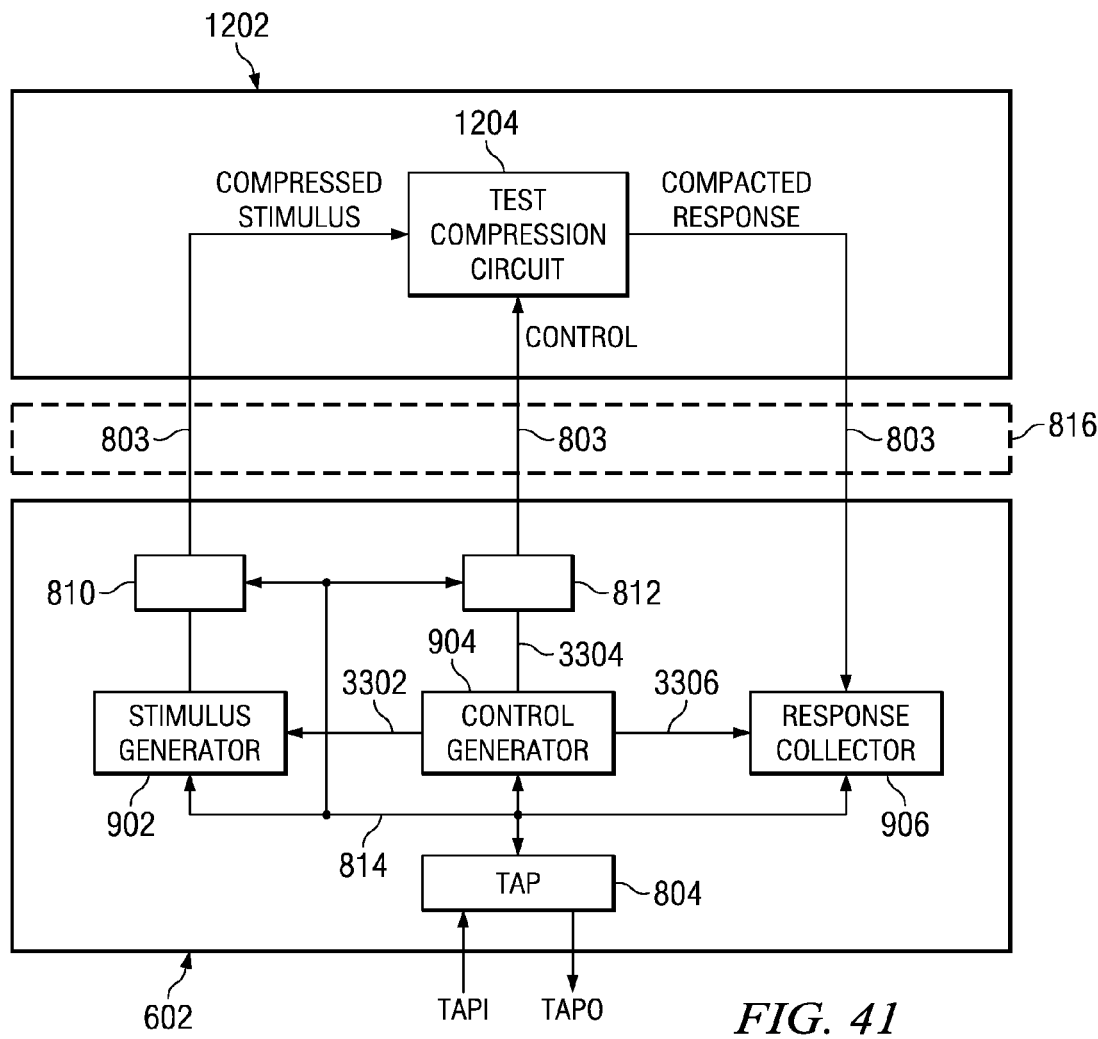
FIG. 41 illustrates a test compression circuit being tested by the test interposer.

FIG. 41 illustrates an example of a die 1202 coupled either directly or indirectly, through TSVs 803 of intermediate die 816, to the test interposer 602 of FIG. 33. The test interposer 602 is connected to the TAPI and TAPO signals of a TAP controller 2904. In this example, multiplexer 810 is set to couple the outputs of stimulus generator 902 to the compressed stimulus inputs of a test compression circuit 1204 in die 1202, multiplexer 812 is set to couple the outputs of control generator 904 to the control inputs of the test compression circuit 1204 and the compacted response outputs from test compression circuit 1204 are input to response collector 906. The stimulus generator 902, control generator 904 and response collector 906 may be, but are not limited to being, any of the previously described stimulus generators 902, control generator 904 and response collector 906 circuits.

Figure 42:
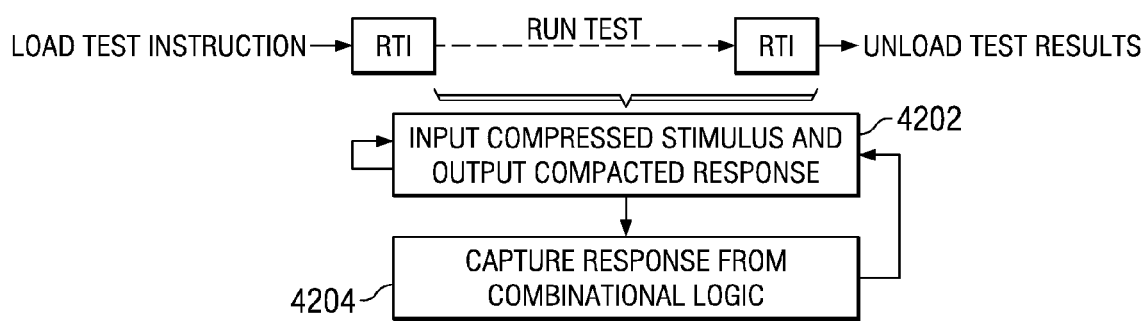
FIG. 42 illustrate the TAP state transitions during the test of FIG. 41.

As seen in FIG. 42, the test begins by loading a test instruction into the TAP 804 via the TAPI and TAPO buses to set the TEN signal. After loading the instruction, the TAP is transitioned to the Run Test/Idle (RTI) state to enable the control generator 904. While the TAP is in the RTI state, the control generator 904 operates in at least a first state 4202 and a second state 4204. In state 4202, the control generator controls the stimulus generator 902 via bus 3302 to input compressed stimulus to the test compression circuit controls the response collector 906 via bus 3306 to input compacted response from the test compression circuit and controls the test compression circuit via bus 3304 to input the compressed inputs and output the compacted outputs. In state 4204, the control generator controls the test compression circuit via bus 3304 to capture response output from combinational logic. The control generator transitions between states 4202 and 4204 while the TAP is in the RTI state. The test ends when the TAP transitions from the RTI state. At the end of test, the TAP is accessed via the TAPI and TAPO buses to unload the test results stored in the response collector 906.

Testable Memory Example Using the Test Interposer

Figure 43:
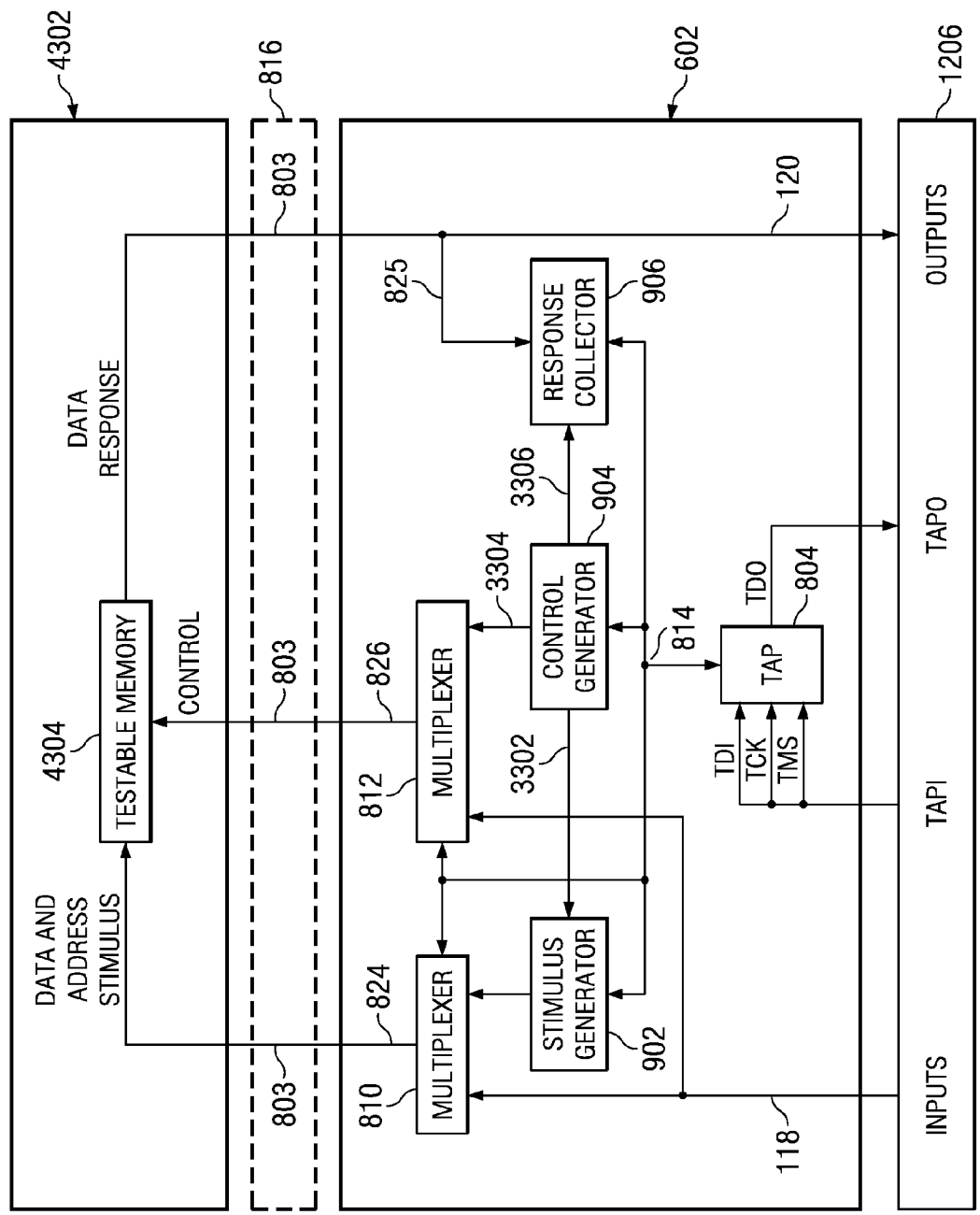
FIG. 43 illustrates a testable memory being tested by the test interposer.

FIG. 43 illustrates a die 4302 containing a testable memory 4304 coupled to a tester 1206 via a test interposer 602, either directly or indirectly via TSVs 803 of intermediate die 816. The test interposer includes a TAP 804, stimulus generator 902, control generator 904, response collector 906, multiplexer 810 and multiplexer 812. The control generator can be controlled by the TAP via bus 814 to output control signals 3302 to stimulus generator 902, control signals 3304 to multiplexer 812 and control signals 3306 to response collector 906.

If the test interposer 602 is set to allow the memory 4304 to be tested by the tester 1206, multiplexer 810 is controlled by TAP 804 to input data and address stimulus 824 to the memory from tester 1206 via bus 118 and multiplexer 812 is controlled by the TAP 804 to input test control 826 to the memory from tester 1206 via bus 118. The data response from the memory is output to tester 1206 via bus 120.

If the test interposer 602 is set to allow the memory to be tested by the stimulus generator 902 and control generator 904, multiplexers 810 and 812 will be controlled by TAP 804 to couple the data and address stimulus output from the stimulus generator and the test control output from the control generator to the memory via buses 824 and 826. The data response from the memory is input to the response collector 906 via bus 825 from bus 120.

Figure 44:
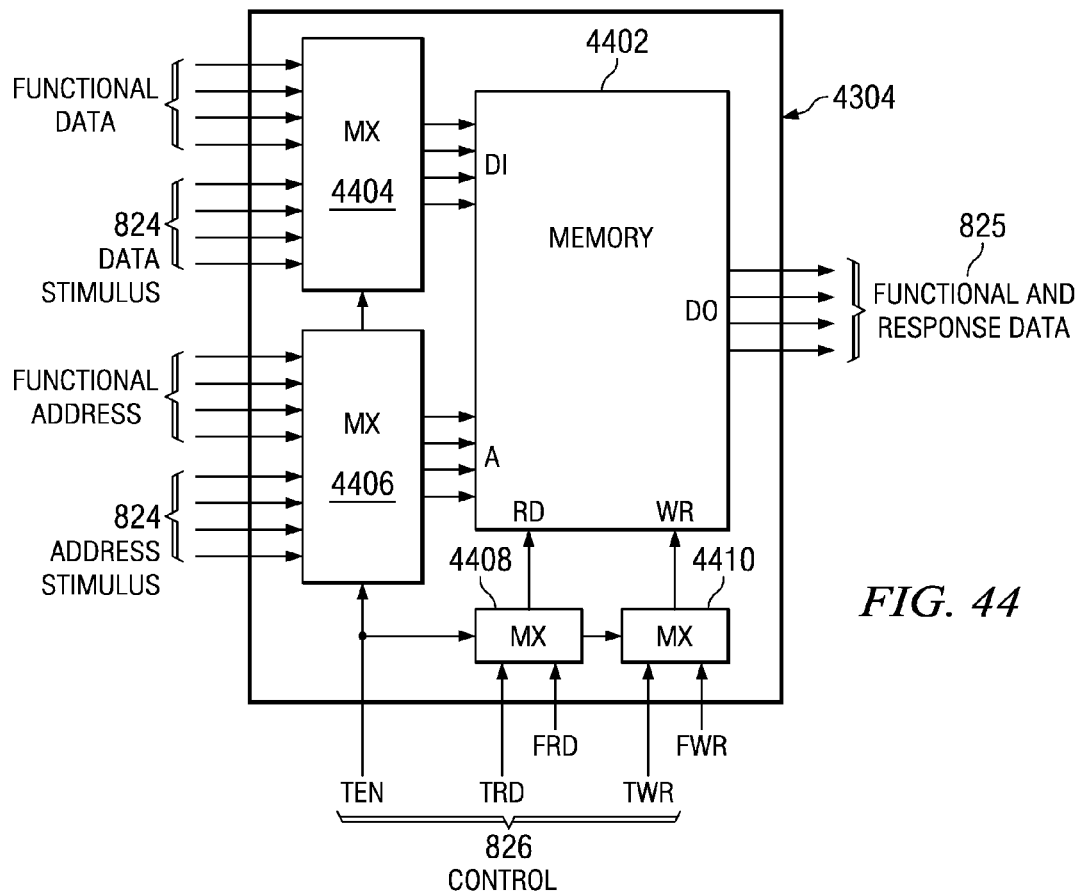
FIG. 44 illustrates a testable memory.

FIG. 44 illustrates an example of a testable memory 4304 that includes a read/write memory 4402, a data input multiplexer 4404, address input multiplexer 4406, read control multiplexer 4408 and a write control multiplexer 4410. Memory 4402 has a data input (DI) bus, an address (A) input bus, a read (RD) input signal, a write (WR) input signal and a data output (DO) bus. Multiplexer 4404 inputs a functional data bus, a data stimulus bus 824, a TEN signal from bus 826 and outputs a data bus to the DI of the memory. Multiplexer 4406 inputs a functional address bus, an address stimulus bus 824, the TEN signal and outputs an address bus to the address (A) input bus of the memory. Multiplexer 4408 inputs a functional read (FRD) signal, a test read (TRD) signal from bus 826, the TEN signal and outputs a read signal to the RD input of the memory. Multiplexer 4410 inputs a functional write (FWR) signal, a test write (TWR) signal from bus 826, the TEN signal 826 and outputs a write signal to the WR input of the memory. During functional operation, the TEN signal controls the multiplexers to couple the memory to the functional data bus, functional address bus, FRD signal and FWR signal. During test operation, the TEN signal controls the multiplexers to couple the memory to the data stimulus bus, address stimulus bus and the TRD and TWR signals.

Figure 45:
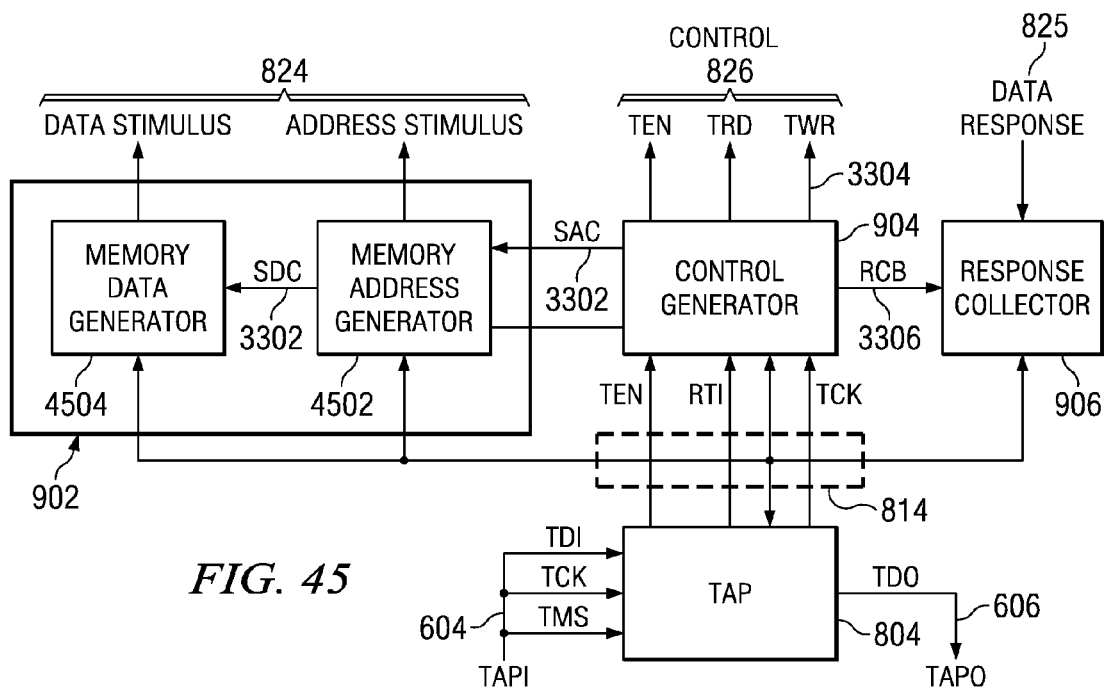
FIG. 45 illustrates the TAP controlling stimulus, control and response circuitry of the testable memory of FIG. 43.

FIG. 45 illustrates one example of how the TAP 804 may control the operation of the control generator 904 of FIG. 43. As seen the TAP control bus 814 of FIG. 10 is expanded to include the TEN, RTI and TCK signals described in FIG. 34. To enable the control generator 904, the TAP is accessed via TAPI and TAPO to load an instruction into the TAP instruction register 1002, which sets the TEN signal. Next, the TAP is transitioned into the Run Test/Idle state which sets the RTI signal. When TEN and RTI are both set, the control generator responds to the TCK input to; (1) operate a stimulus address control (SAC) bus 3302 to a memory address generator 4502 in stimulus generator 902, (2) operate a stimulus data control (SDC) bus 3302 to a memory data generator 4504 in stimulus generator 902, (3) operate the TEN, TRD and TWR control signals 3304 to memory 4304 and (4) operate the response control bus (RCB) 3306 to response collector 906. Response collector 906 may be, but is not limited to being, any of the described response collector circuits of FIGS. 37-40.

When the SAC bus is operated, the memory address generator 4502 outputs address stimulus to memory 4304. When the SDC bus is operated, the memory data generator 4504 outputs data stimulus to memory 4304. The output data stimulus may be any type, such as but not limited to, walking ones, walking zeros and/or checkerboard patterns. When the TEN and TWR signals are operated, test data is written to the memory. When the TEN and TRD signals are operated, test data is read from the memory. When the RCB is operated, the response collector inputs the test data from the memory.

Figure 46:
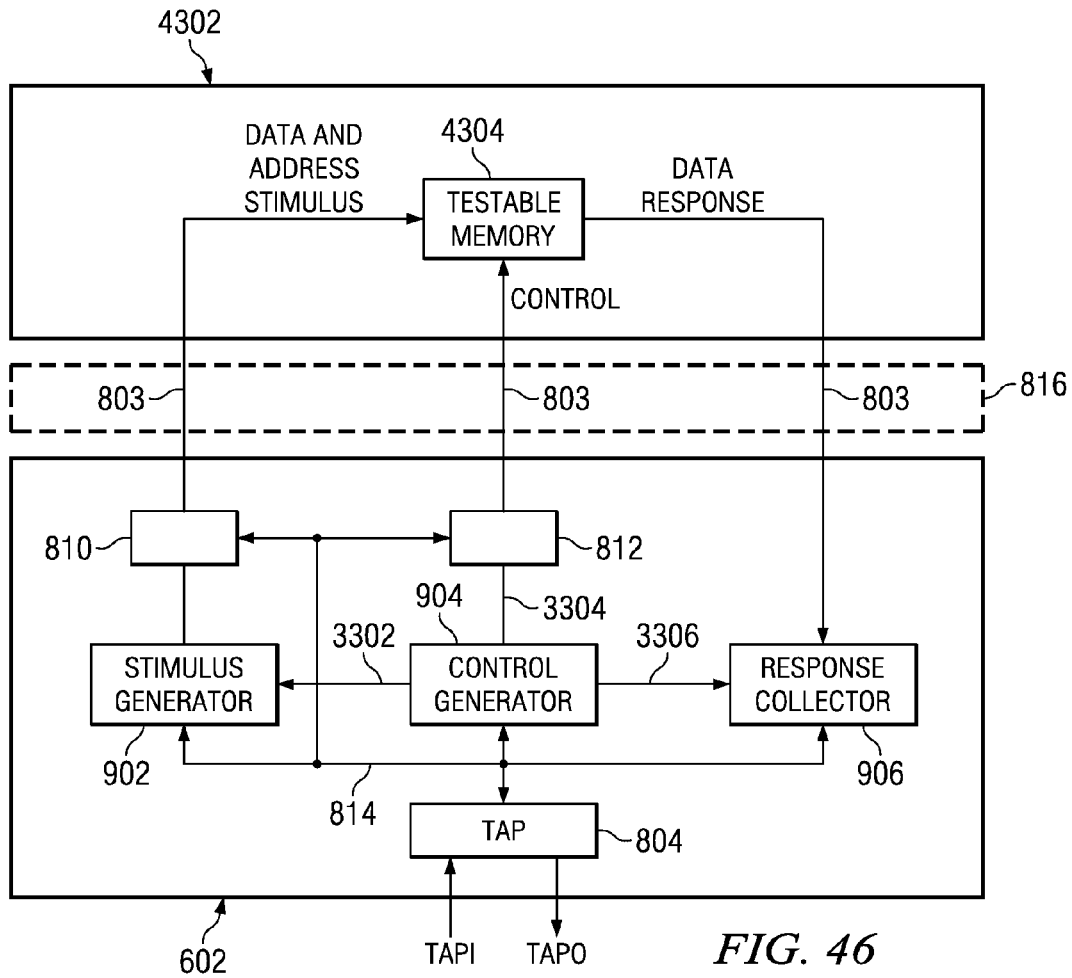
FIG. 46 illustrates a testable memory being tested by the test interposer.

FIG. 46 illustrates an example of a die 4302 coupled either directly or indirectly, through TSVs 803 of intermediate die 816, to the test interposer 602 of FIG. 43. The test interposer 602 is connected to the TAPI and TAPO signals of a TAP controller 2904. In this example, multiplexer 810 is set to couple the outputs of stimulus generator 902 to the data and address stimulus inputs of a testable memory 4304 in die 4302, multiplexer 812 is set to couple the outputs of control generator 904 to the control inputs of the testable memory 4304 and the data response outputs from testable memory 4304 are input to response collector 906. The stimulus generator 902 and control generator 904 may be designed in any suitable manner to achieve the data and address stimulus input testing requirements of memory 4304. The response collector 906 may be, but is not limited to being, any of the previously describe response circuits 906.

Figure 47:
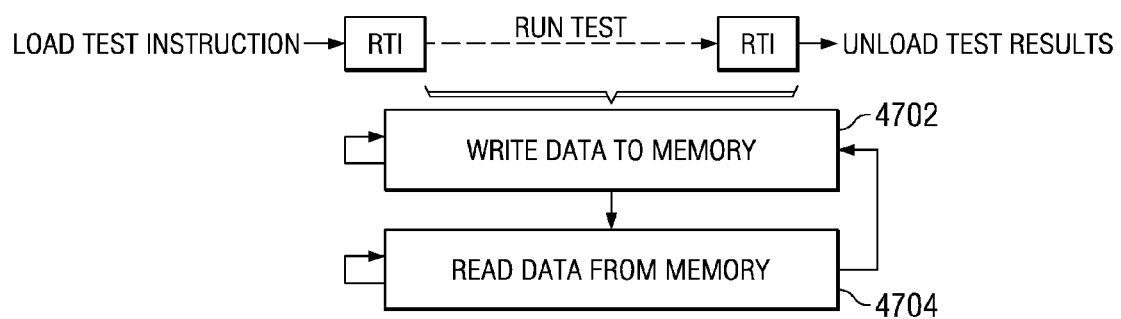
FIG. 47 illustrate the TAP state transitions during the test of FIG. 43.

As seen in FIG. 47, the test begins by loading a test instruction into the TAP 804 to set the TEN signal. After loading the instruction, the TAP is transitioned to the Run Test/Idle state to set the RTI signal to enable the control generator 904. While the TAP is in the RTI state, the control generator 904 operates in at least a first state 4702 and a second state 4704. In the first state 4702, the control generator 904 operates stimulus generator 902 via the SAC and SDC buses 3302 to generate data and address stimulus to memory 4304 and operates the TEN and TWR signals of bus 3304 to write the data stimulus into the memory. In the second state 4704, the control generator 904 operates stimulus generator 902 via the SAC bus to generate address stimulus to memory 4304, operates the TEN and TRD signals of bus 3304 to read the data response from the memory and operates the response collector 906 to input the data response from the memory. The control generator 904 may transition between states 4702 and 4704 in any desired manner. For example, state 4702 may write data to a single memory location then transition to state 4704 to read back the data from the single memory location, or state 4702 may write data to all memory locations then transition to state 4704 and read back the data from all memory locations.

Testable ADC Example Using the Test Interposer

Figure 48:
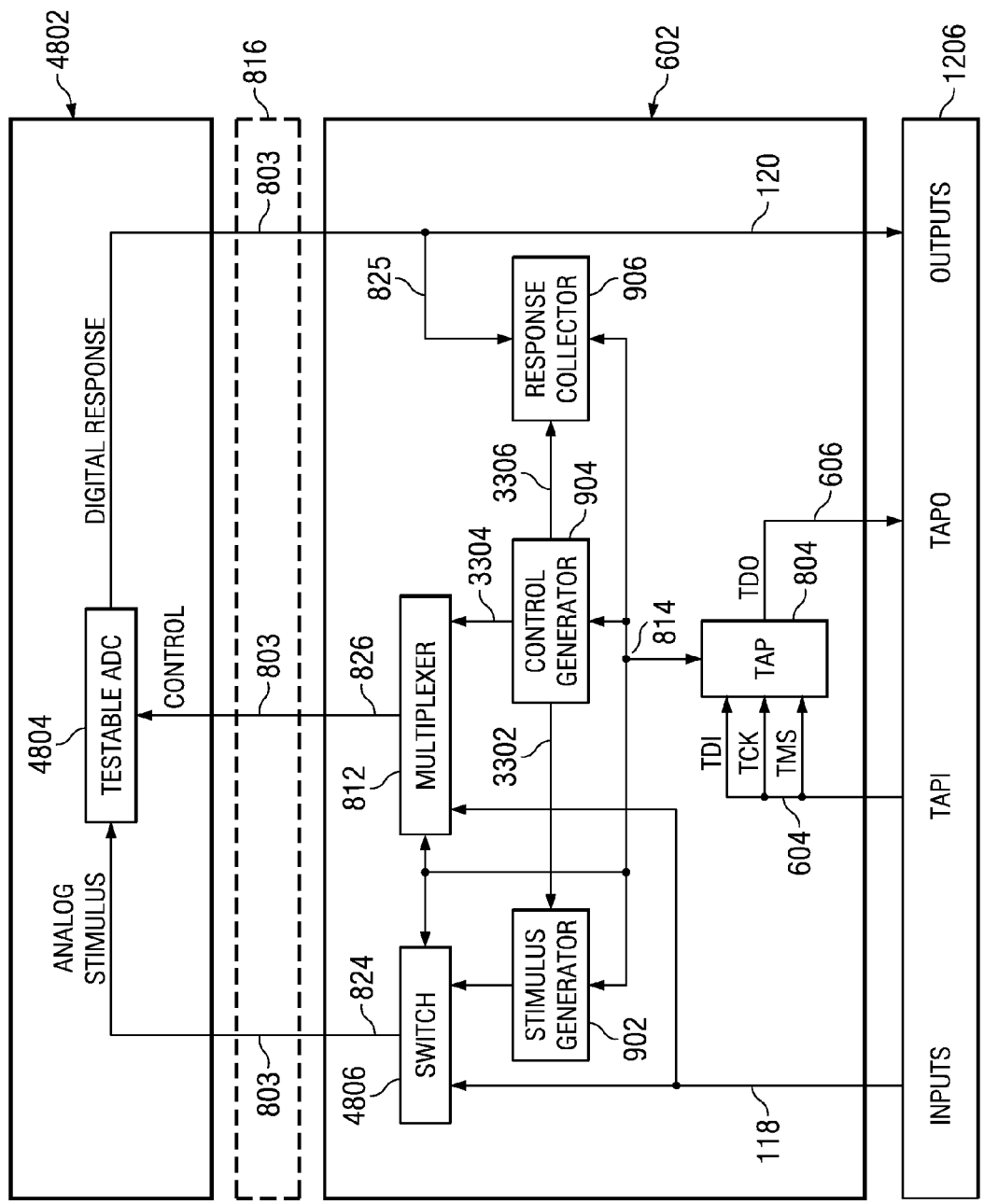
FIG. 48 illustrates a testable ADC being tested by the test interposer.

FIG. 48 illustrates a die 4802 containing a testable analog to digital converter (ADC) 4804 coupled to a tester 1206 via a test interposer 602, either directly or indirectly via TSVs 803 of intermediate die 816. The test interposer includes a TAP 804, stimulus generator 902, control generator 904, response collector 906, analog switch 4806 and multiplexer 812. The control generator can be controlled by the TAP via bus 814 to output control signals 3302 to stimulus generator 902, control signals 3304 to multiplexer 812 and control signals 3306 to response collector 906.

If the test interposer 602 is set to allow the ADC 4804 to be tested by the tester 1206, switch 4806 is controlled by TAP 804 to input analog stimulus 824 to the ADC from tester 1206 via bus 118 and multiplexer 812 is controlled by the TAP 804 to input test control 826 to the ADC from tester 1206 via bus 118. The digital response from the ADC is output to tester 1206 via bus 120.

If the test interposer 602 is set to allow the ADC to be tested by the stimulus generator 902 and control generator 904, switch 4706 and multiplexer 812 will be controlled by TAP 804 to couple the analog stimulus output from the stimulus generator and the test control output from the control generator to the ADC via buses 824 and 826. The digital response from the ADC is input to the response collector 906 via bus 825 from bus 120.

Figure 49:
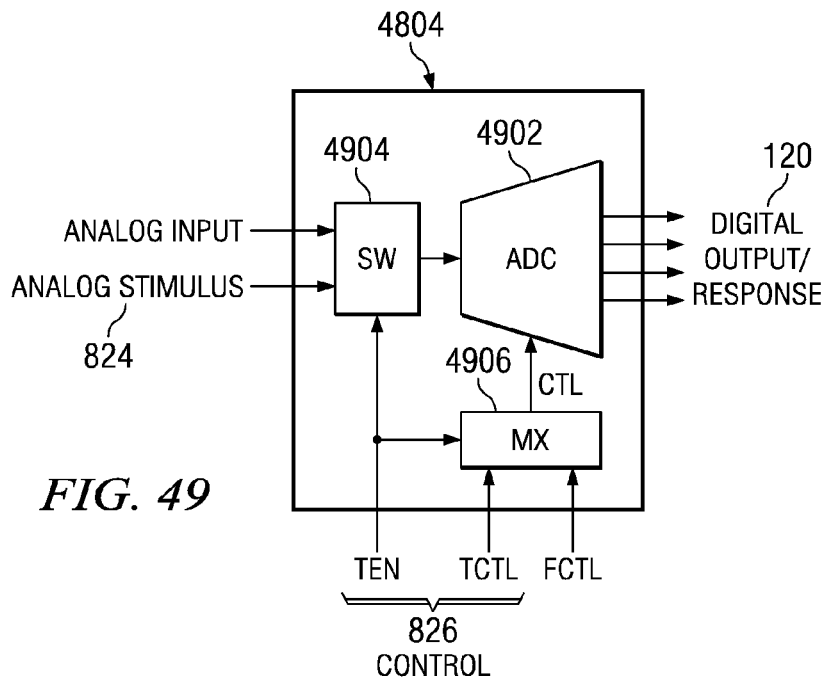
FIG. 49 illustrates a testable ADC.

FIG. 49 illustrates an example of a testable ADC 4804 that includes an ADC 4902, an analog input switch 4904, and a control input multiplexer 4906. ADC 4902 has an analog input, control (CTL) input(s), and digital outputs. Switch 4904 inputs a functional analog signal, an analog stimulus signal from bus 824, a TEN signal from bus 826 and outputs an analog signal to the analog input of the ADC. Multiplexer 4906 inputs functional control (FCTL), test control (TCTL) from bus 826, the TEN signal and outputs control to the CTL input(s) of the ADC. During functional operation, the TEN signal controls the switch and multiplexer to couple the ADC to the functional analog input and the FCTL input(s). During test operation, the TEN signal controls the switch and multiplexer to couple the ADC to the analog stimulus input and the TCTL input(s).

Figure 50:
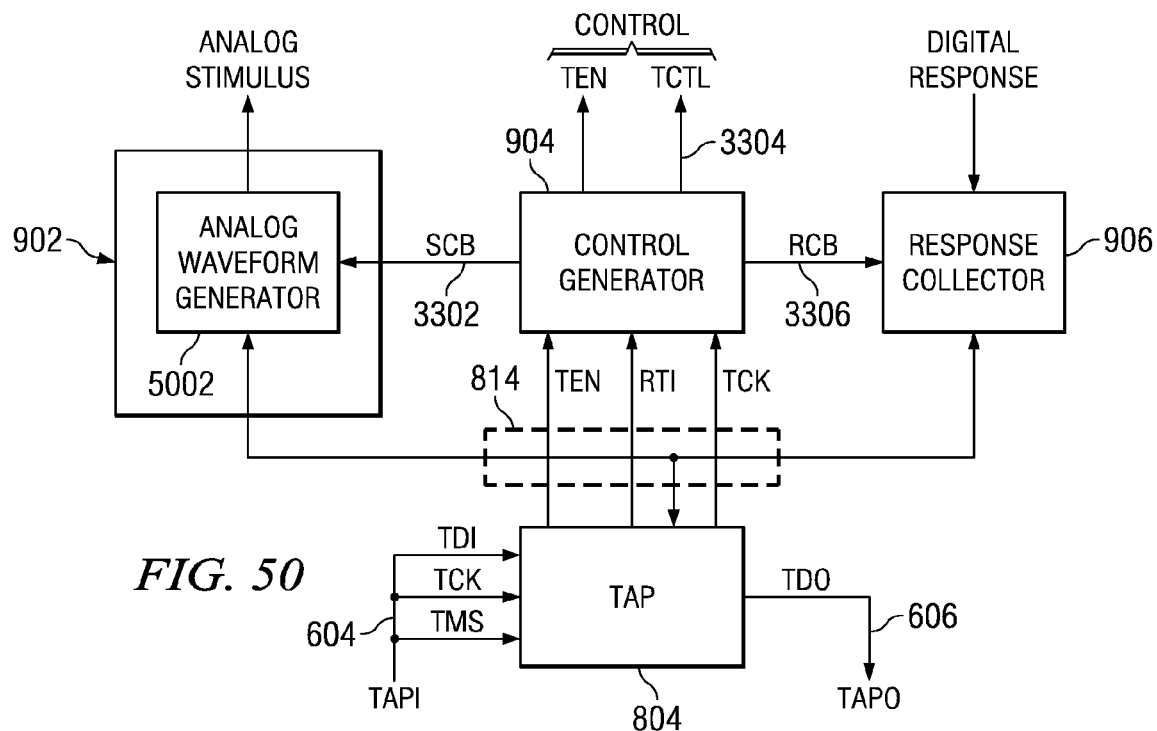
FIG. 50 illustrates the TAP controlling stimulus, control and response circuitry of the testable ADC of FIG. 48.

FIG. 50 illustrates one example of how the TAP 804 may control the operation of the control generator 904 of FIG. 48. As seen the TAP control bus 814 of FIG. 10 is expanded to include the TEN, RTI and TCK signals described in FIG. 34. To enable the control generator 904, the TAP is accessed via TAPI and TAPO to load an instruction into the TAP instruction register 1002, which sets the TEN signal. Next, the TAP is transitioned into the Run Test/Idle state which sets the RTI signal. When TEN and RTI are both set, the control generator responds to the TCK input to; (1) operate a stimulus control bus (SCB) 3302 to an analog waveform generator 5002 in stimulus generator 902, (2) operate the TEN and TCTL signals 3304 to ADC 4804 and (3) operate the response control bus (RCB) 3306 to response collector 906. Response collector 906 may be, but is not limited to being, any of the described response collector circuits of FIGS. 37-40.

When the SCB is operated, the analog waveform generator 5002 outputs analog stimulus to ADC 4804. When the TEN and TCTL signals are operated, the ADC inputs the analog stimulus, converts it to digital response and outputs the digital response. When the RCB is operated, the response collector inputs the digital response from the ADC.

Figure 51:
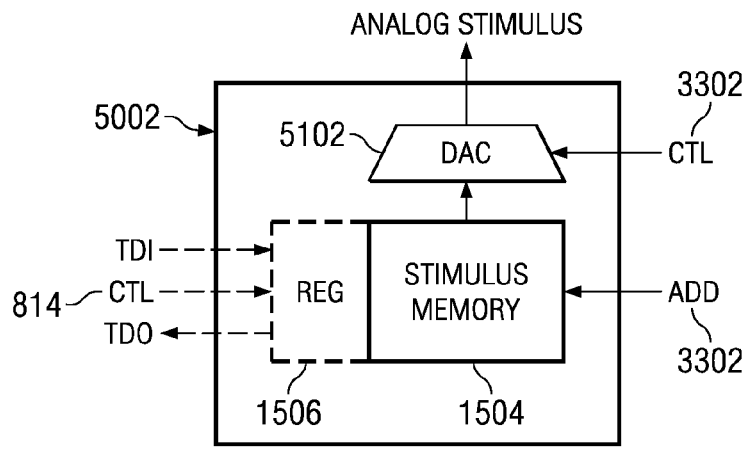
FIGS. 51-53 illustrate stimulus generator circuits of the disclosure.

FIG. 51 illustrates a first example implementation of an analog waveform generator 5002 of stimulus generator 902 for generating analog stimulus to ADC 4804. The waveform generator 5002 includes a digital to analog converter (DAC) 5102 and a stimulus memory 1504, which may be a ROM or a RAM, as previously described. If it is a RAM memory a register 1506 will be provided on the memory to allow the TAP to write data into the memory via control bus 814. The DAC has a data input bus coupled to the stimulus memory data output bus, control (CTL) input(s) from SCB 3302 of control generator 904 and an output for providing analog stimulus to the ADC 4804. The stimulus memory 1504 has an address (ADD) input bus from SCB 3302 of control generator 904 and data outputs to DAC 5102. When the control generator 904 is enabled by TAP 804, it operates the memory address bus to output data patterns to the DAC and operates the CTL input(s) of the DAC to convert each of the data patterns into an analog stimulus output to the ADC 4804. These operations are repeated during the test.

Figure 52:
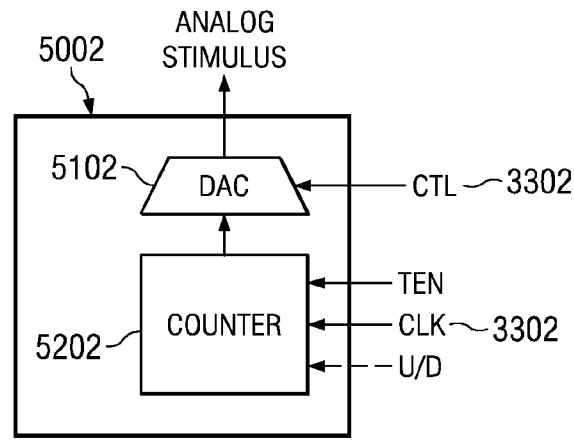

FIG. 52 illustrates a second example implementation of an analog waveform generator 5002 of stimulus generator 902 for generating analog stimulus to ADC 4804. The waveform generator 5002 includes a DAC 5102 and a counter 5202. The DAC has a data input bus coupled to the counter output bus, CTL input(s) from SCB 3302 and an output for providing analog stimulus to the ADC 4804. The counter has inputs for the TEN signal, a clock (CLK) signal and optionally an up/down (U/D) count control signal from SCB 3302 and a count output bus to DAC 5102. When the control generator 904 is enabled by TAP 804, it enables the counter from a known count state with the TEN signal and operates the counter with the CLK signal. Each time a count pattern is output to the DAC the control generator operates the CTL input(s) of the DAC to convert each of the count patterns into an analog stimulus output to the ADC 4804. If used, the operational U/D signal from the control generator causes the counter to count up and count down to create analog stimulus outputs that controllably ramp up and ramp down.

Figure 53:
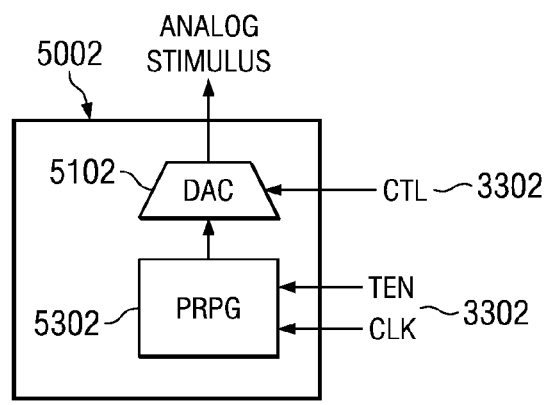

FIG. 53 illustrates a third example implementation of an analog waveform generator 5002 of stimulus generator 902 for generating analog stimulus to ADC 4804. The waveform generator 5002 includes a DAC 5102 and a pseudo-random pattern generator (PRPG) 5302. The DAC has a data input bus coupled to the PRPG pattern output bus, CTL input(s) from SCB 3302 and an output for providing analog stimulus to the ADC 4804. The PRPG has inputs for the TEN and CLK signals from SCB 3302 and a pattern output bus to DAC 5102. When the control generator 904 is enabled by TAP 804, it enables the PRPG from a known pattern state with the TEN signal and operates the PRPG with the CLK signal. Each time a pattern is output to the DAC the control generator operates the CTL input(s) of the DAC to convert each of the patterns into an analog stimulus output to the ADC 4804. This waveform generator 5002 produces pseudo-random amplitude analog stimulus outputs to ADC 4804.

Figure 54:
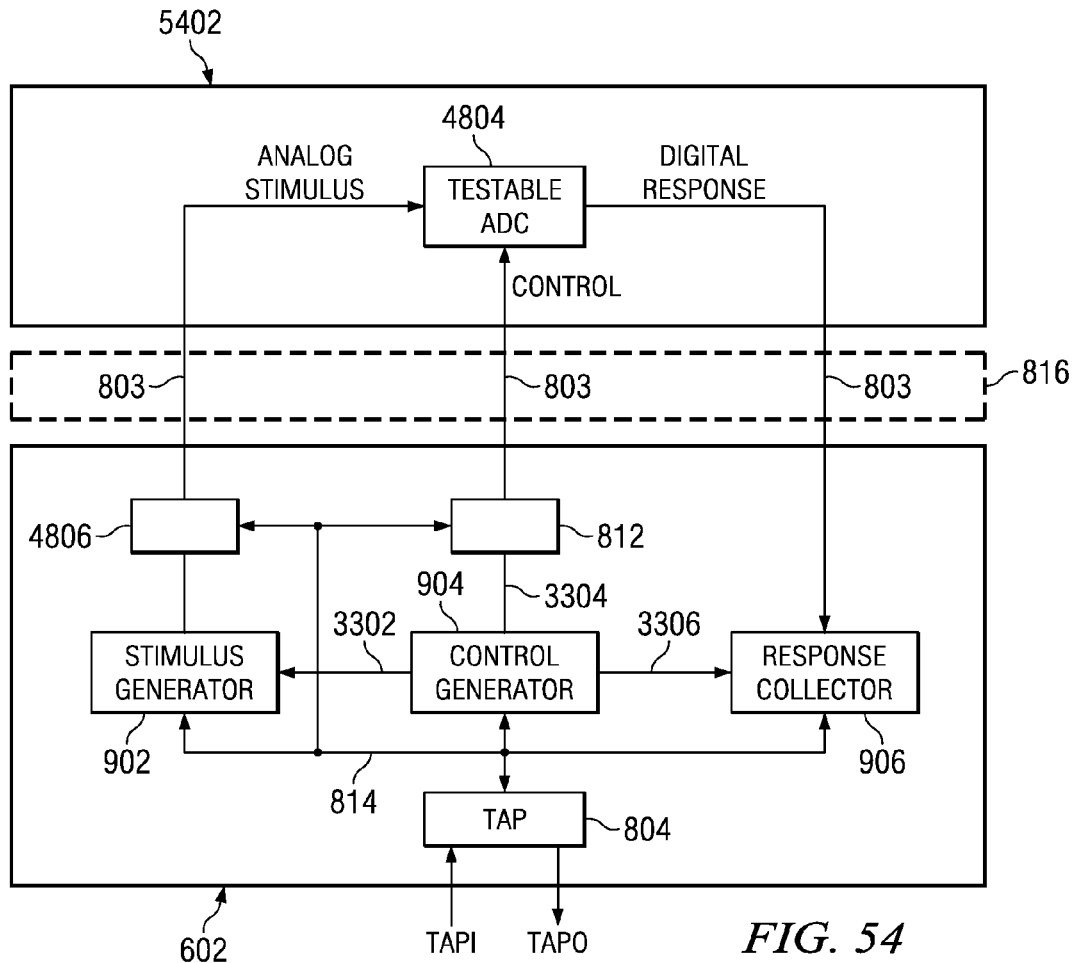
FIG. 54 illustrates a testable ADC being tested by the test interposer.

FIG. 54 illustrates an example of a die 5402 coupled either directly or indirectly, through TSVs 803 of intermediate die 816, to the test interposer 602 of FIG. 48. The test interposer 602 is connected to the TAPI and TAPO signals of a TAP controller 2904. In this example, switch 4806 is set to couple the outputs of stimulus generator 902 to the analog stimulus inputs of a testable ADC 4804 in die 5402, multiplexer 812 is set to couple the outputs of control generator 904 to the control inputs of the testable ADC and the data response outputs from the testable ADC are input to response collector 906. The stimulus generator 902 may be, but is not limited to being, and of the stimulus generators of FIGS. 51-54. The response collector 906 may be, but is not limited to being, any of the previously describe response circuits 906.

Figure 55:
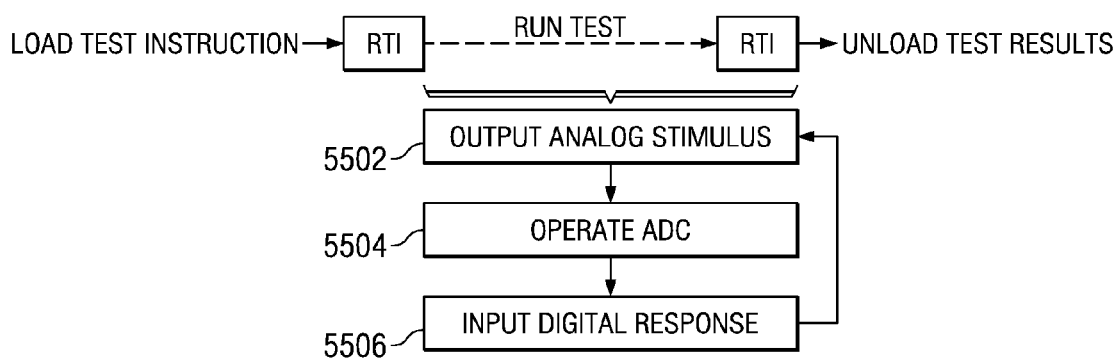
FIG. 55 illustrates the TAP state transitions during the test of FIG. 54.

As seen in FIG. 55, the test begins by loading a test instruction into the TAP 804 to set the TEN signal. After loading the instruction, the TAP is transitioned to the Run Test/Idle state to set the RTI signal to enable the control generator 904. While the TAP is in the RTI state, the control generator 904 operates in at least a first state 5502, a second state 5504 and a third state 5506. In the first state 5502, the control generator 904 operates stimulus generator 902 via the SCB 3302 to generate an output analog stimulus to testable ADC 4804. In the second state 5504, the control generator operates the TEN and TCTL signals of bus 3304 to operate the testable ADC to convert the analog stimulus input into a digital response output. In the third state 5506, the control generator 904 operates response collector 906 via RCB 3306 to input the digital response from the testable ADC 4804. These states are repeated during the test.

Testable DAC Example Using the Test Interposer

Figure 56:
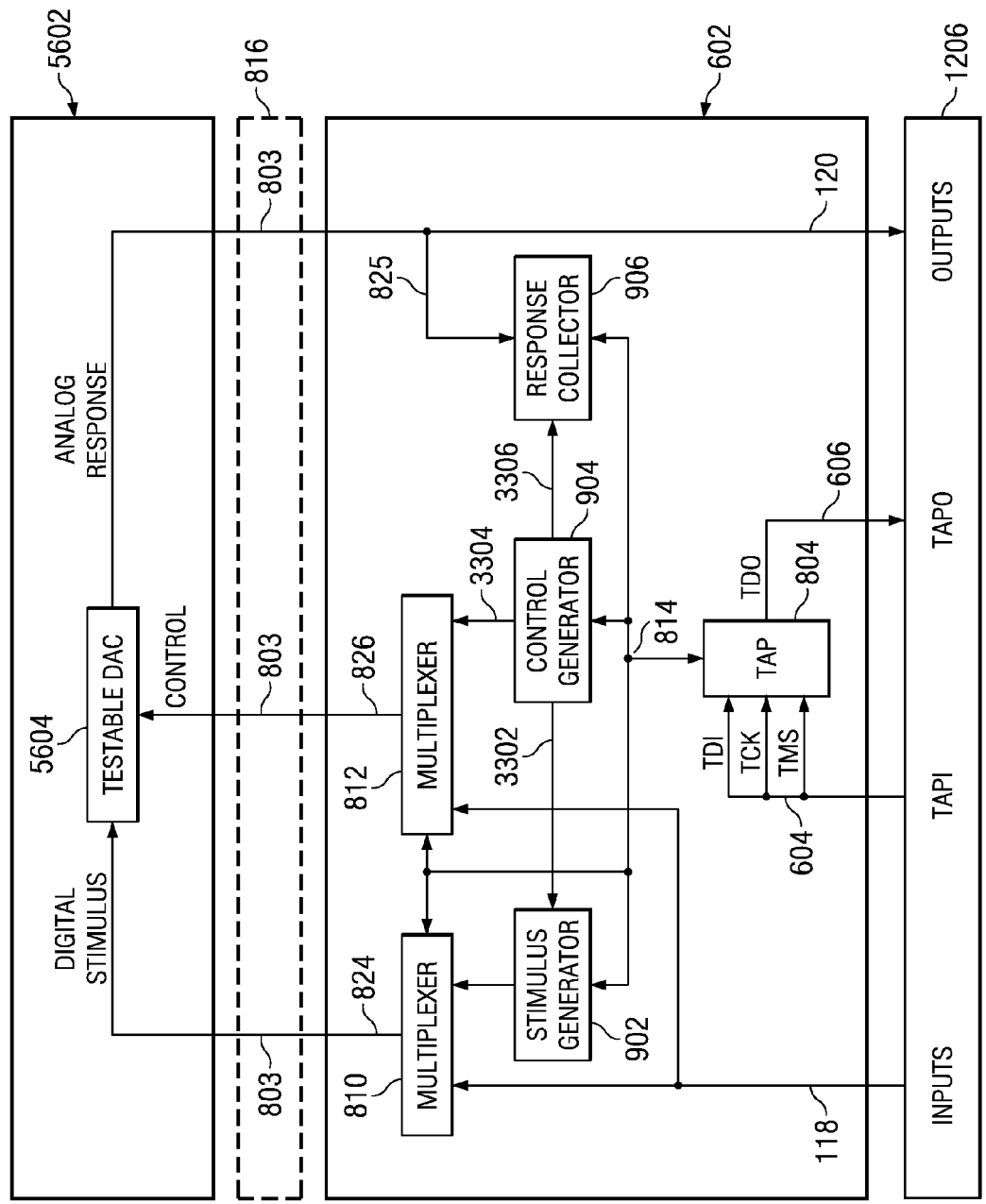
FIG. 56 illustrates a testable DAC being tested by the test interposer.

FIG. 56 illustrates a die 5602 containing a testable digital to analog converter (DAC) 5604 coupled to a tester 1206 via a test interposer 602, either directly or indirectly via TSVs 803 of intermediate die 816. The test interposer includes a TAP 804, stimulus generator 902, control generator 904, response collector 906 and multiplexers 810 and 812. The control generator can be controlled by the TAP via bus 814 to output control signals 3302 to stimulus generator 902, control signals 3304 to multiplexer 812 and control signals 3306 to response collector 906.

If the test interposer 602 is set to allow the testable DAC 5604 to be tested by the tester 1206, multiplexer 810 is controlled by TAP 804 to input digital stimulus 824 to the DAC from tester 1206 via bus 118 and multiplexer 812 is controlled by the TAP 804 to input test control 826 to the DAC from tester 1206 via bus 118. The analog response from the DAC is output to tester 1206 via bus 120.

If the test interposer 602 is set to allow the testable DAC to be tested by the stimulus generator 902 and control generator 904, multiplexer 810 and multiplexer 812 will be controlled by TAP 804 to couple the digital stimulus output from the stimulus generator and the test control output from the control generator to the DAC via buses 824 and 826. The analog response from the DAC is input to the response collector 906 via bus 825 from bus 120.

Figure 57:
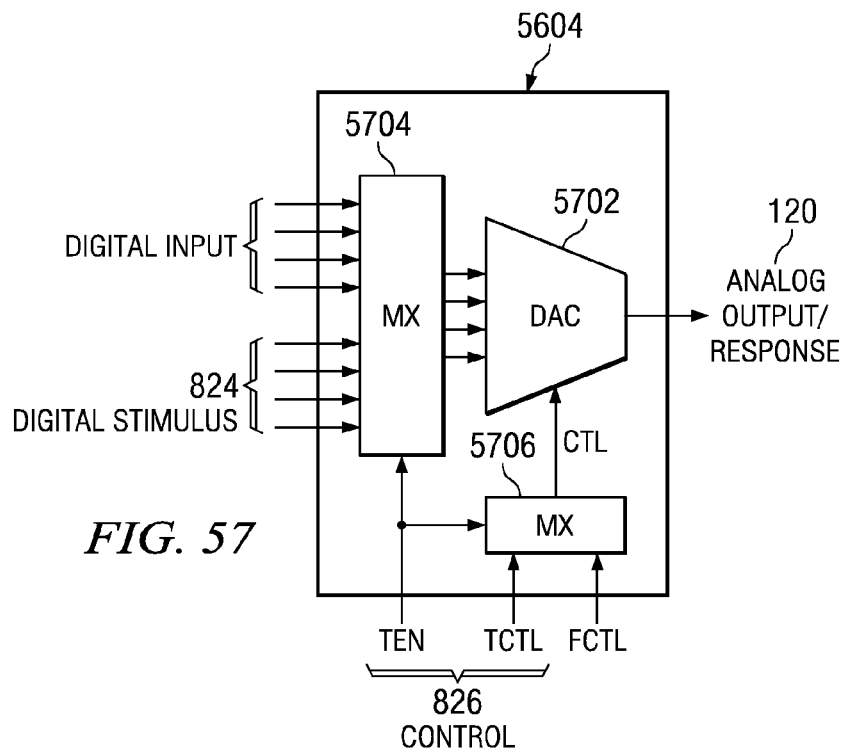
FIG. 57 illustrates a testable DAC.

FIG. 57 illustrates an example of a testable DAC 5604 that includes a DAC 5702, a digital input multiplexer 5704, and a control input multiplexer 5706. DAC 5702 has digital inputs, control (CTL) input(s), and an analog output. Multiplexer 5704 inputs functional digital signals, digital stimulus signals from bus 824, a TEN signal from bus 826 and outputs digital signals to the digital inputs of the DAC. Multiplexer 5706 inputs functional control (FCTL), test control (TCTL) from bus 826, the TEN signal and outputs control to the CTL input(s) of the DAC. During functional operation, the TEN signal controls the multiplexers to couple the DAC to the functional digital inputs and the FCTL input(s). During test operation, the TEN signal controls the multiplexers to couple the DAC to the digital stimulus inputs and the TCTL input(s).

Figure 58:
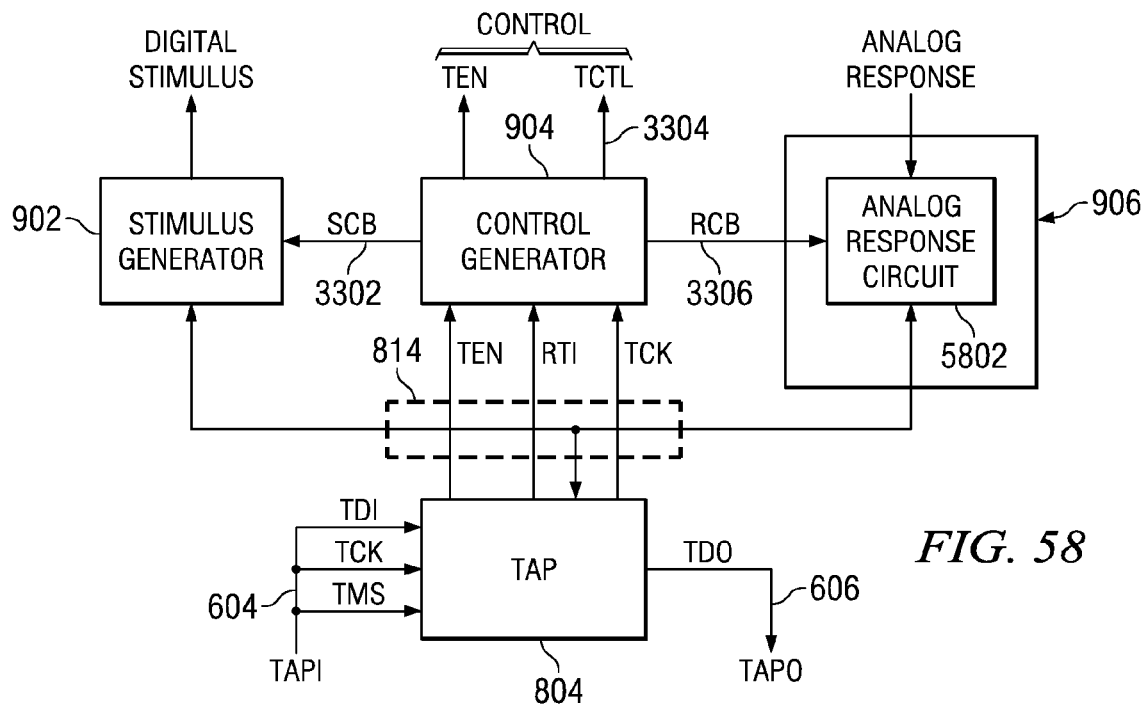
FIG. 58 illustrates the TAP controlling stimulus, control and response circuitry of the testable DAC of FIG. 56.

FIG. 58 illustrates one example of how the TAP 804 may control the operation of the control generator 904 of FIG. 56. As seen the TAP control bus 814 of FIG. 10 is expanded to include the TEN, RTI and TCK signals described in FIG. 34. To enable the control generator 904, the TAP is accessed via TAPI and TAPO to load an instruction into the TAP instruction register 1002, which sets the TEN signal. Next, the TAP is transitioned into the Run Test/Idle state which sets the RTI signal. When TEN and RTI are both set, the control generator responds to the TCK input to; (1) operate a stimulus control bus (SCB) 3302 to the stimulus generator 902, (2) operate the TEN and TCTL signals 3304 to DAC 5604 and (3) operate the response control bus (RCB) 3306 to an analog response circuit 5802 in response collector 906. Stimulus generator 902 may be, but is not limited to being, any of the described stimulus generator circuits of FIGS. 35 and 36.

When the SCB is operated, the stimulus generator 902 outputs digital stimulus to DAC 5604. When the TEN and TCTL signals are operated, the DAC inputs the digital stimulus, converts it to an analog response signal and outputs the analog response signal. When the RCB is operated, the analog response circuit 5802 in response collector 906 inputs the analog response signal from the DAC.

Figure 59:
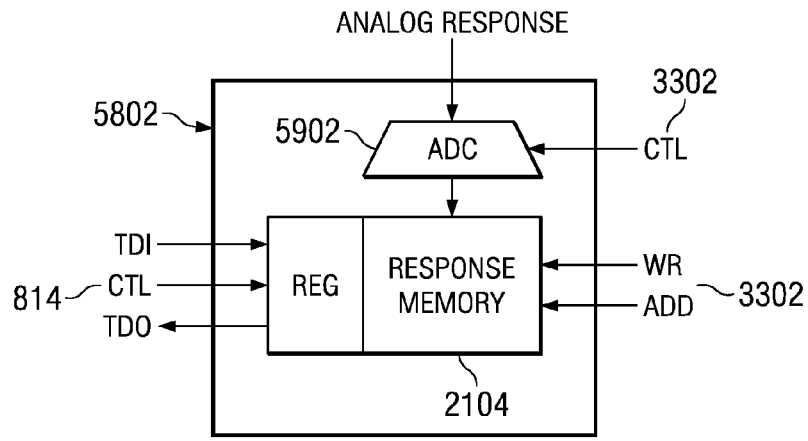
FIG. 59 illustrates a response collector circuit of the disclosure.

FIG. 59 illustrates an example implementation of an analog response circuit 5802 of response collector 906 for inputting the analog response output from DAC 5604. The analog response circuit 5802 includes an analog to digital convertor (ADC) 5902 and a response memory 2104, which may be a RAM. A register is provided on the memory 2104 to allow the TAP to read data from the memory via control bus 814. The ADC has a digital output bus coupled to the response memory data input bus, control (CTL) input(s) from SCB 3302 of control generator 904 and an analog input coupled to the analog response output of the DAC 5604. The response memory 2104 has an address (ADD) input and a write (WR) input from SCB 3302 of control generator 904 and data inputs coupled to ADC 5902. When the control generator 904 is enabled by TAP 804, it operates the CTL input(s) to the ADC to convert an analog response signal from DAC 5604 into a digital representation, operates the ADD inputs to the response memory to select a memory location and operates the WR input to the response memory to write the digital representation into the memory location. These operations are repeated during the test.

Figure 60:
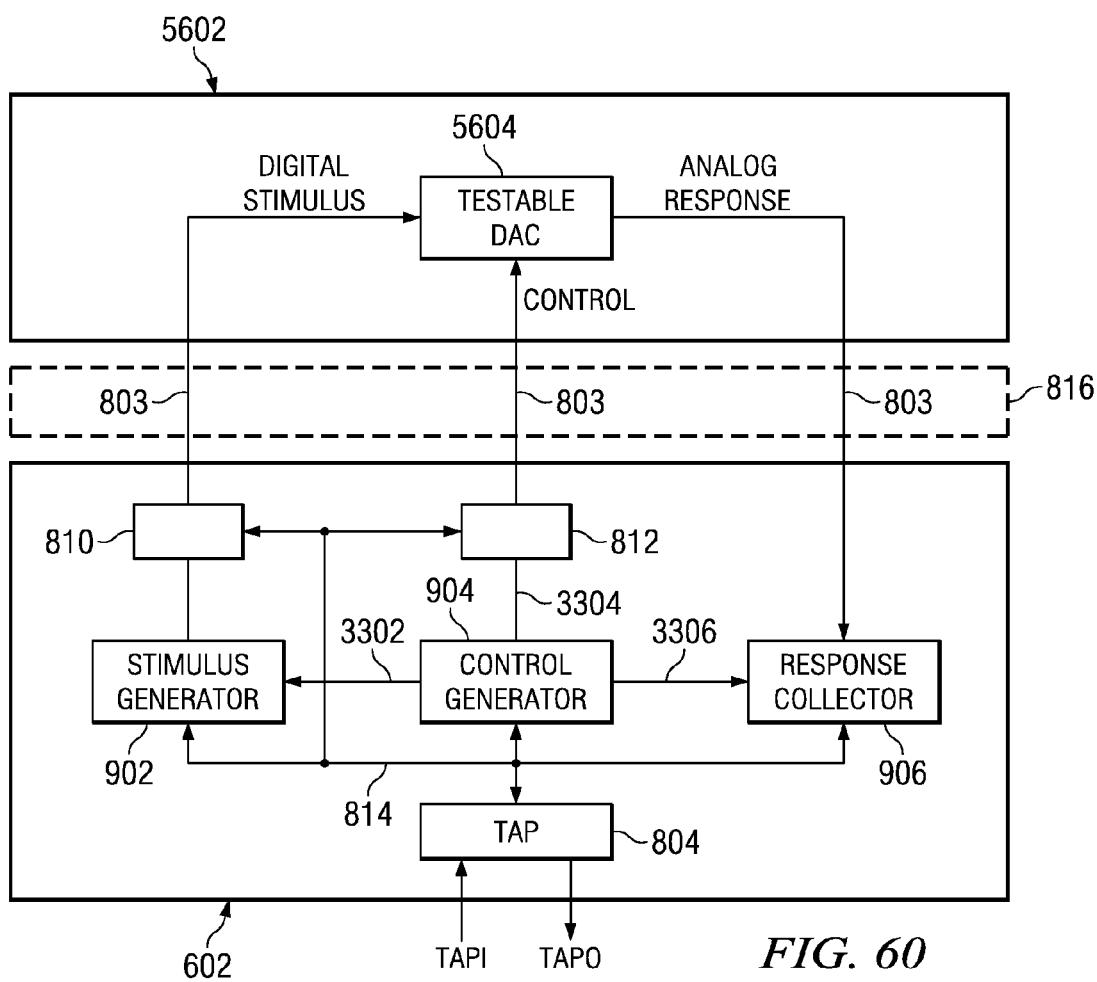
FIG. 60 illustrates a testable DAC being tested by the test interposer.

FIG. 60 illustrates an example of a die 5602 coupled either directly or indirectly, through TSVs 803 of intermediate die 816, to the test interposer 602 of FIG. 56. The test interposer 602 is connected to the TAPI and TAPO signals of a TAP controller 2904. In this example, multiplexer 810 is set to couple the outputs of stimulus generator 902 to the digital stimulus inputs of a testable DAC 5604 in die 5602, multiplexer 812 is set to couple the outputs of control generator 904 to the control inputs of the testable DAC and the analog response outputs from the testable DAC are input to response collector 906. The stimulus generator 902 may be, but is not limited to being, any of the stimulus generators of FIGS. 35-36. The response collector 906 may be, but is not limited to being, the response collector of FIG. 59.

Figure 61:
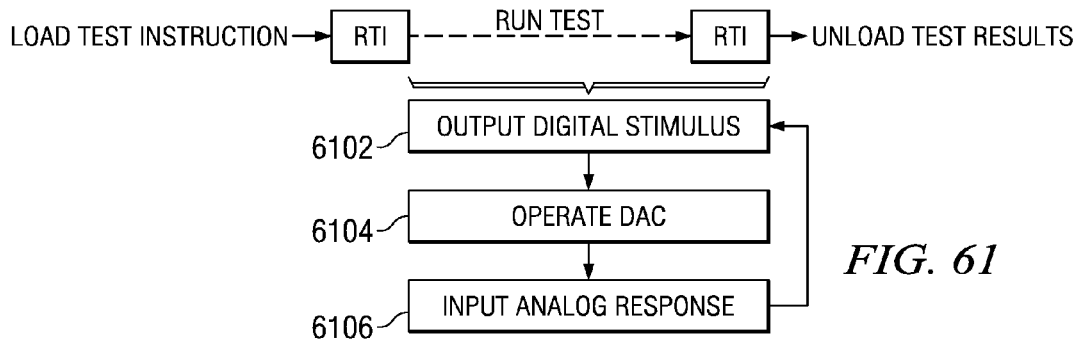
FIG. 61 illustrates the TAP state transitions during the test of FIG. 60.

As seen in FIG. 61, the test begins by loading a test instruction into the TAP 804 to set the TEN signal. After loading the instruction, the TAP is transitioned to the Run Test/Idle state to set the RTI signal to enable the control generator 904. While the TAP is in the RTI state, the control generator 904 operates in at least a first state 6102, a second state 6104 and a third state 6106. In the first state 6102, the control generator 904 operates stimulus generator 902 via the SCB 3302 to generate and output digital stimulus to testable DAC 5604. In the second state 6104, the control generator operates the TEN and TCTL signals of bus 3304 to operate the DAC to convert the digital stimulus inputs into an analog response output. In the third state 6106, the control generator 904 operates response collector 906 via RCB 3306 to input the analog response from the DAC 5604. These states are repeated during the test.

Figure 62:
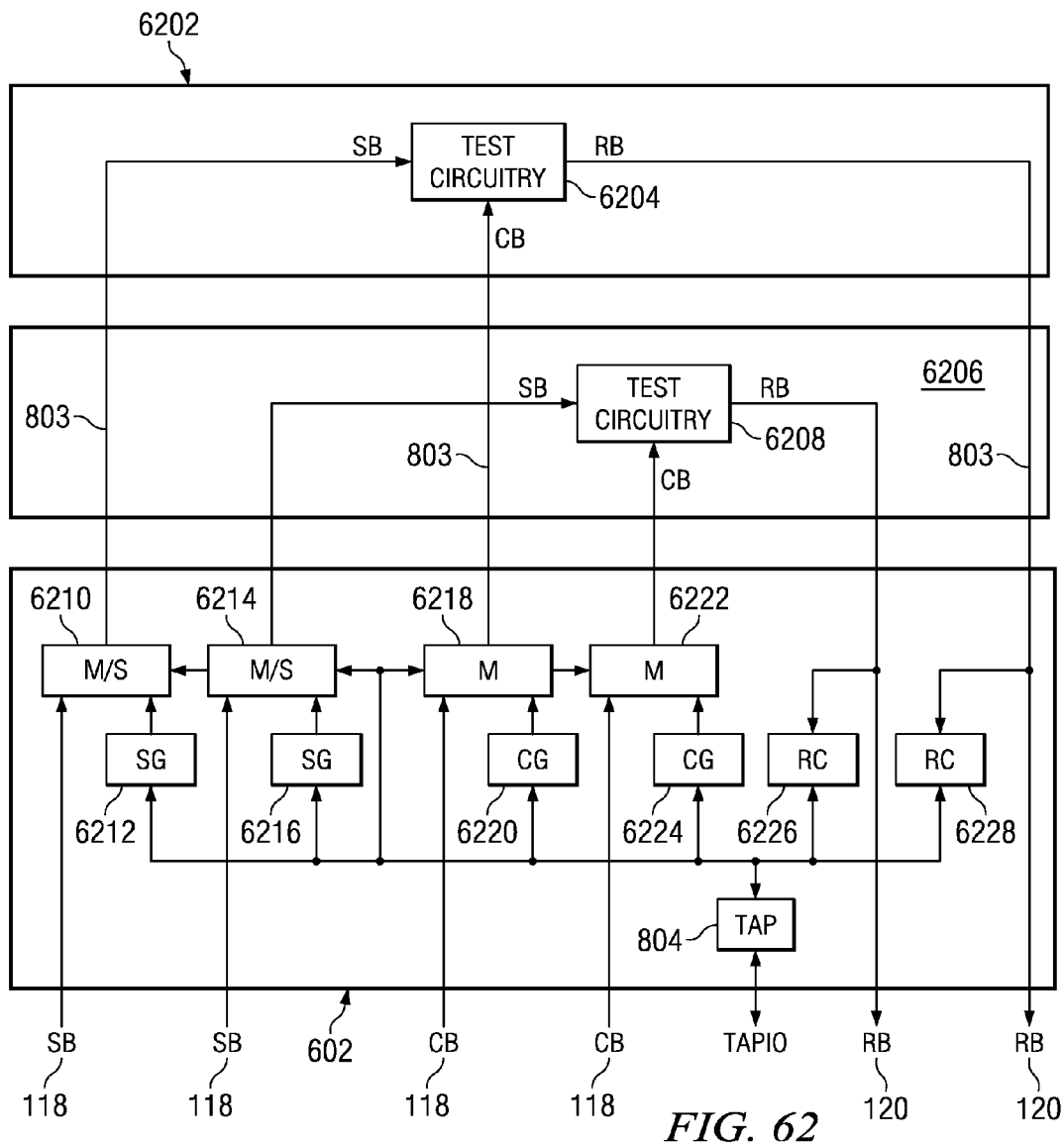
FIG. 62 illustrates stacked die mounted upon a first example realization of the test interposer of the disclosure, which is based upon separate bussing of stimulus, control and response signals.

FIG. 62 illustrates a first example of a die 6202 with analog or digital test circuitry 6204 mounted on top of a die 6206 with analog or digital test circuitry 6208 which is mounted on a test interposer 602 of the disclosure.

The stimulus bus (SB) to test circuitry 6204 comes from one of a TAP controlled multiplexer and analog switch (M/S) 6210 via TSVs 803 of die 6206. M/S 6210 receives stimulus input from either a tester via a SB on bus 118 or a TAP controlled stimulus generator (SG) 6212. The stimulus bus (SB) to test circuitry 6208 comes from one of a TAP controlled M/S 6214. M/S 6214 receives stimulus input from either a tester via a SB on bus 118 or a TAP controlled SG 6216. SGs 6212 and 6216 may be, but are not limited to being, any of the previously described SGs 902.

The control bus (CB) to test circuitry 6204 comes from a TAP controlled multiplexer (M) 6218 via TSVs 803 of die 6206. M 6218 receives control input from either a tester via a CB on bus 118 or a TAP controlled control generator (CG) 6220. The CB to test circuitry 6208 comes from a TAP controlled M 6222. M 6222 receives stimulus input from either a tester via a CB on bus 118 or a TAP controlled CG 6224. CGs 6220 and 6224 may be, but are not limited to being, any of the previously described CGs 904.

The response bus (RB) from test circuitry 6204 is output to a TAP controlled response collector (RC) 6228 and to a tester via a RB on bus 120. The RB output from test circuitry 6208 passes through TSVs 803 of die 6206. The RB from test circuitry 6208 is output to a TAP controlled RC 6226 and to a tester via a RB on bus 120. RCs 6226 and 6228 may be, but are not limited to being, any of the previously described RCs 906.

While not shown, CG 6220 provides control input 3302 to SG 6212 and control input 3306 to RC 6228 and CG 6224 provides control input 3302 to SG 6216 and control input 3306 to RC 6226, as shown in FIG. 43.

Figure 63:
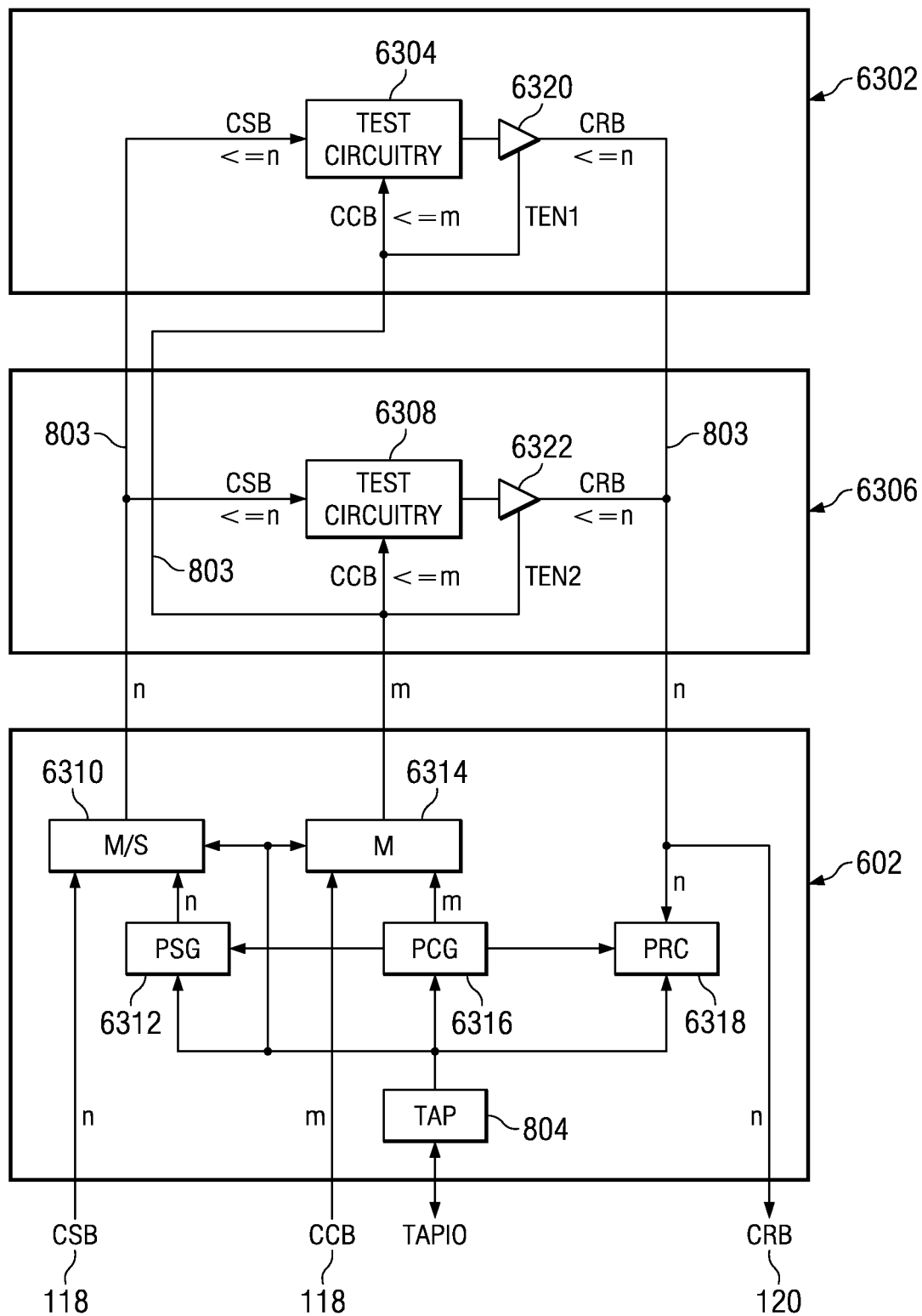
FIG. 63 illustrates stacked die mounted upon a second example realization of the test interposer of the disclosure, which is based upon common bussing of stimulus, control and response signals.

FIG. 63 illustrates a second example of a die 6302 with analog or digital test circuitry 6304 mounted on top of a die 6306 with analog or digital test circuitry 6308 which is mounted on a test interposer 602 of the disclosure. Instead of using separate SB, CB and RB interfaces to each test circuit 6304 and 6308 of FIG. 63, this example uses a common stimulus bus (CSB), a common control bus (CCB) and a common response bus (CRB) interface to test circuits 6304 and 6308.

As seen, an n-wide CSB is input to test circuits 6304 and 6308 from one of a TAP controlled multiplexer and analog switch (M/S) 6310. The CSB to test circuit 6304 passes through TSVs 803 of die 6306. M/S 6310 receives stimulus input from either a tester via the CSB on bus 118 or a TAP controlled programmable stimulus generator (PSG) 6312.

An m-wide CCB is input to test circuits 6304 and 6306 from a TAP controlled multiplexer (M) 6314. The CCB to test circuit 6304 passes through TSVs 803 of die 6306. M 6314 receives control input from either a tester via the CCB on bus 118 or a TAP controlled programmable control generator (PCG) 6316.

The response output from test circuits 6304 and 6308 are selectively coupled to an n-wide common response bus (CRB) via tri-state buffers or analog switches 6320 and 6322 associated with the test circuits. When test circuit 6304 is being operated, a TEN signal from the CCB will enable buffer/switch 6320 and when test circuit 6308 is being operated, a TEN signal from the CCB will enable buffer/switch 6322. When test circuit 6304 is being accessed, its response output will pass through TSVs 803 of die 6306. The CRB is input to a TAP controlled programmable response collector (PRC) 6318 and is output to a tester on bus 120.

The number of stimulus inputs to test circuits 6304 and 6308 may be less than or equal to the n-wide CSB, the number of control inputs to test circuits 6304 and 6308 may be less than or equal to m-wide CCB and the number of response outputs from test circuit 6304 and 6308 may be less than or equal to the n-wide CRB. In this example it is assumed that one of the test circuits requires an n-wide CSB, an m-wide CCB and an n-wide CRB and the other test circuit may require a lesser-wide CSB, CCB and CRD.

Figure 64:
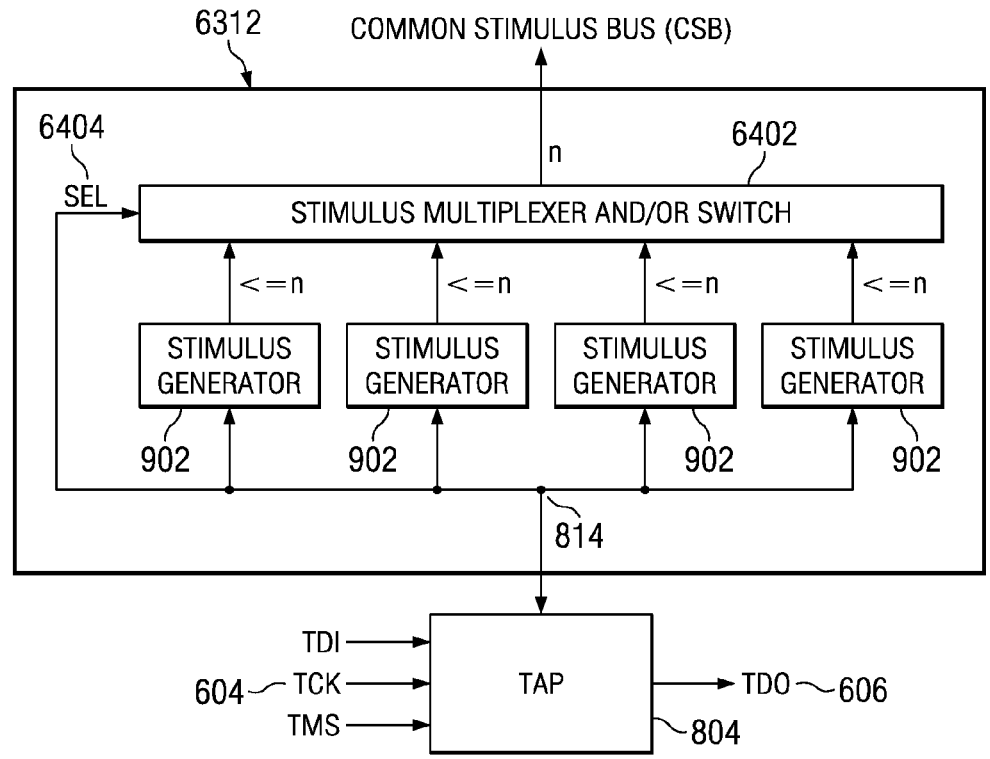
FIG. 64 illustrates an example of a programmable stimulus generator, according to the disclosure.

FIG. 64 illustrates one example implementation of the programmable stimulus generator (PSG) 6312 of FIG. 63. The PSG includes a number of stimulus generators 902 connected to TAP 804 via bus 814. The outputs of the stimulus generators 902 are selectively coupled to the CSB via a stimulus multiplexer and/or analog switch 6402 by a select (SEL) signal 6404 from TAP control bus 814. Once coupled, a stimulus generator 902 may be enabled by the TAP to output analog or digital stimulus to a target test circuit of a die. The stimulus generators 902 may be, but are not limited to being, any of the previously described example stimulus generators 902.

Figure 65:
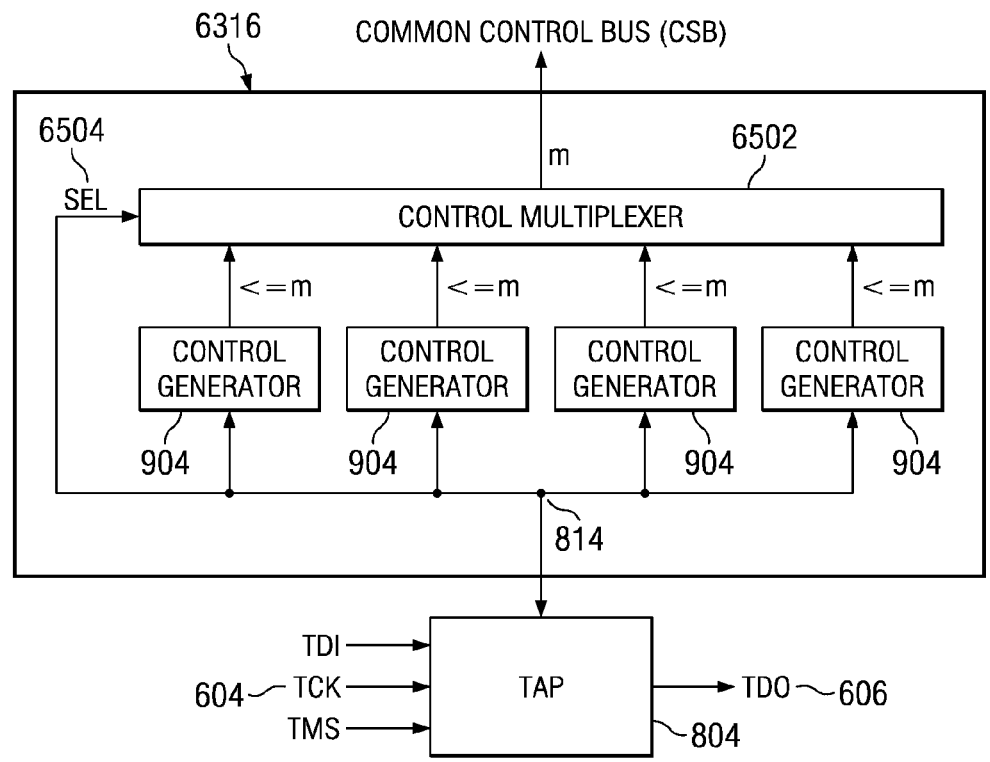
FIG. 65 illustrates an example of a programmable control generator, according to the disclosure.

FIG. 65 illustrates one example implementation of the programmable control generator (PCG) 6316 of FIG. 63. The PCG includes a number of control generators 904 connected to TAP 804 via bus 814. The outputs of the control generators 904 are selectively coupled to the CCB via a control multiplexer 6502 by a select (SEL) signal 6504 from TAP control bus 814. Once coupled, a control generator 904 may be enabled by the TAP to output control to a target test circuit of a die. The control generators 904 may be, but are not limited to being, any of the previously described example control generators 904.

Figure 66:
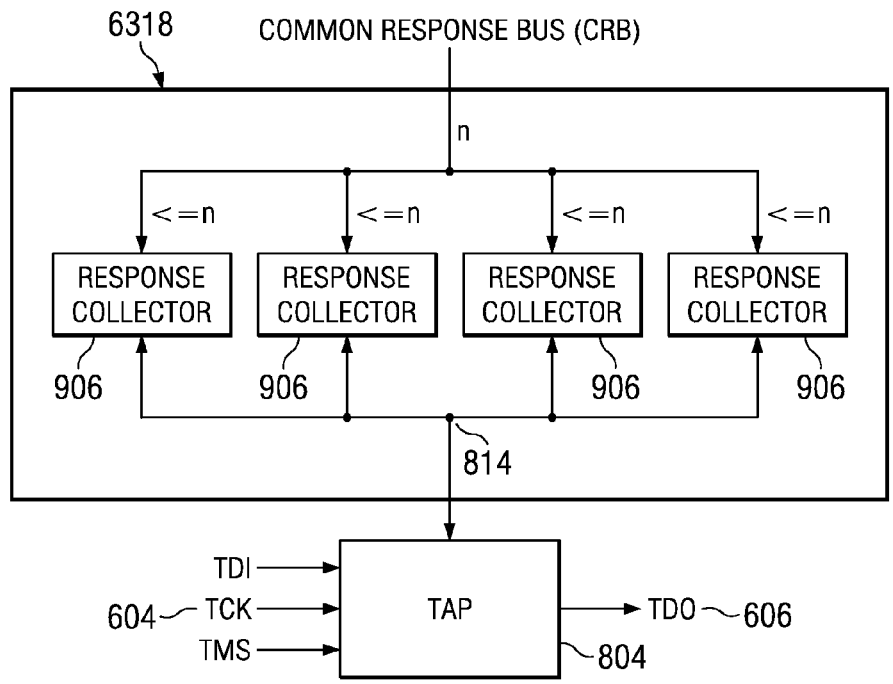
FIG. 66 illustrates an example of a programmable response collector, according to the disclosure.

FIG. 66 illustrates one example implementation of the programmable response collector (PRC) 6318 of FIG. 63. The PRC includes a number of response collectors 906 connected to the CRB and to TAP 804 via bus 814. When enabled by the TAP a response collector inputs the response data from a selected test circuit via the CRB. The response collectors 906 may be, but are not limited to being, any of the previously described example response collectors 906.

Both the test interposer and die stack example of FIGS. 62 and 63 are anticipated in this disclosure. The advantage of the FIG. 62 example is that multiple die test circuits may be tested simultaneously since separate stimulus, control and response buses are provided. The advantage of the FIG. 63 example is the use of common stimulus, control and response buses to each die which reduces the number of test connections between the test interposer and the bottom die and between die stacked on top of the bottom die. Furthermore, the use of common stimulus, control and response buses reduces the number of test TSVs 803 that must be included in each die in the stack.

While this disclosure has described the test interposer as being an improvement to a conventional silicon interposer die 106 which functions as a signal redistribution layer between a stack of die and a substrate on to which it will be mounted, this disclosure anticipates the signal redistribution function of the interposer being incorporated within the bottom die of a stack of die. This will in effect remove one layer in the stack, the interposer, from being required as a separate entity in a stacked die arrangement. Therefore, the test circuitry of the test interposer described herein should be understood to be likewise incorporated within the bottom die of a stack of die. Thus the bottom die of a stack may, according the present invention, include; (1) functional/test circuitry, (2) signal redistribution connections and (3) the test circuitry described in this disclosure.

Figure 4:
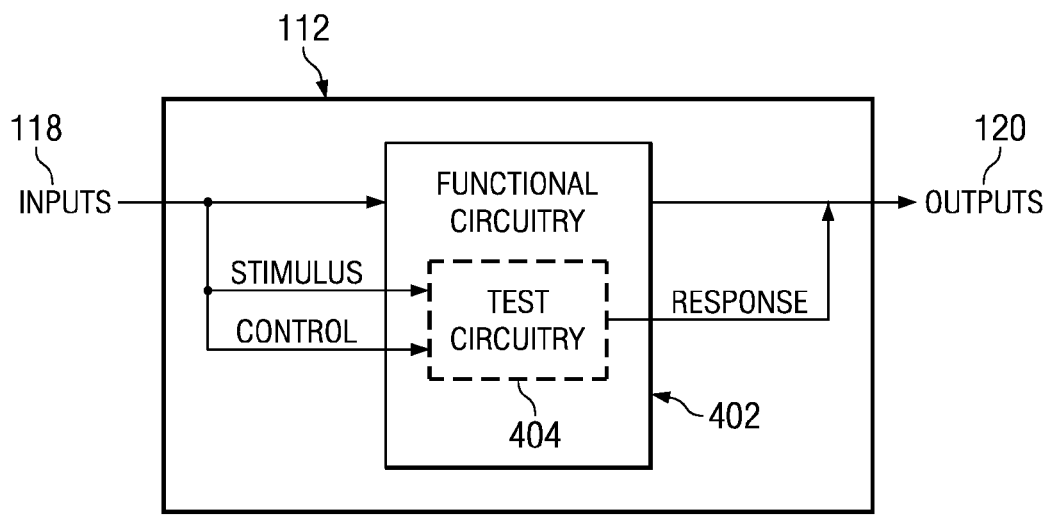
FIG. 4 illustrates functional and test circuitry in a die.
Figure 67:
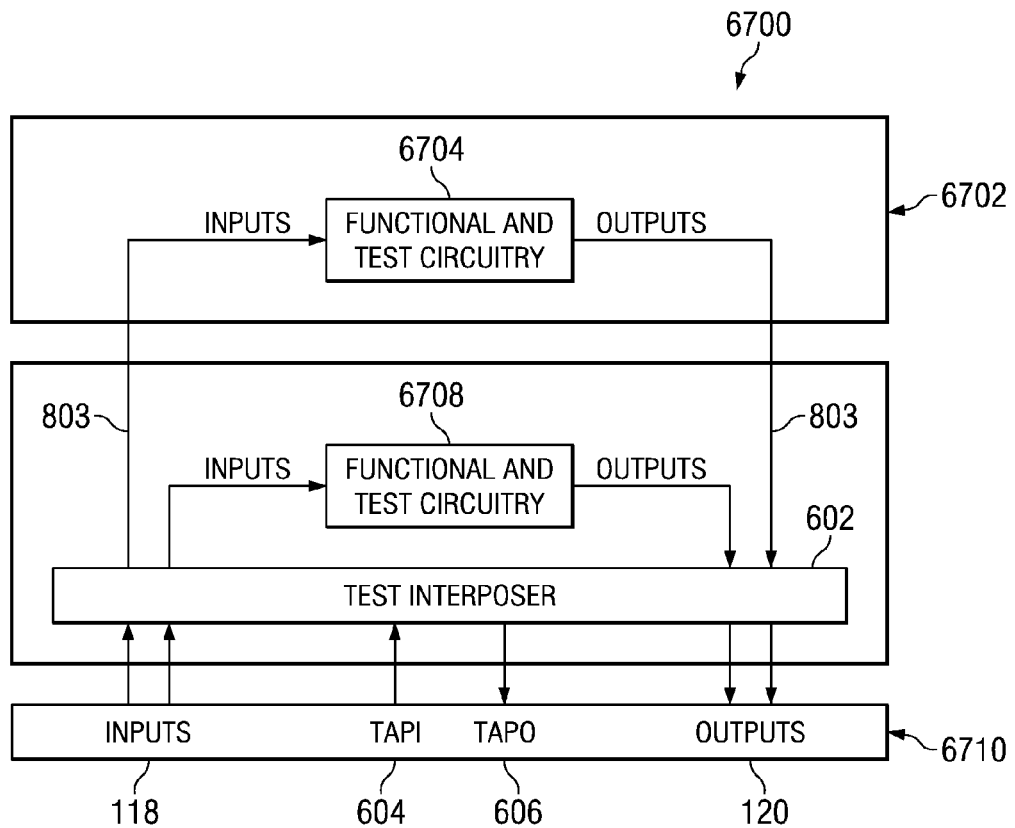
FIG. 67 illustrates an example of where the test interposer of the disclosure is incorporated into the bottom die of a stack of die, eliminating the need for a separate test interposer layer in the stacked die arrangement.

FIG. 67 illustrates an arrangement 6700 which incorporates, as described above, the test interposer 602 of this disclosure into a bottom die 6706 onto which one or more die 6702 may be stacked. Each die in the stack includes both functional circuitry 402 and test circuitry 404 as shown in FIG. 4. The test circuitry may be analog or digital test circuitry. The functional and test circuitry of each die are connected to inputs and outputs of the die. The bottom die 6706 may be connected to a substrate or tester 6710. The test interposer 602 of die 6706 includes at least some or all of the test circuits described in this disclosure, such as a TAP, a stimulus generator, a control generator, a response collector, a multiplexer and an analog switch. During functional operation, the test interposer operates as a conventional interposer to pass functional input and output signals to and from functional circuitry of each die in the stack. During test operation, the test interposer operates, as described in this disclosure, to pass test input and output signals to and from test circuitry of each die in the stack. Thus testing, using the test interposer of this disclosure, may be achieved by realizing the test interposer as a separate entity onto which a die stack is mounted or by realizing the test interposer as an embedded circuit within the bottom die of a die stack.

Although the disclosure has been described in detail, it should be understood that various changes, substitutions and alterations may be made without departing from the spirit and scope of the disclosure as defined by the appended claims.

I claim:

1. An electrical device comprising:
   (A) an integrated circuit die having functional circuitry and test circuitry, the die having through silicon input vias and through silicon output vias coupled to the functional circuitry and the test circuitry, the integrated circuit die having a first face and the through silicon vias having contact points on the first face; and
   (B) a test interposer having a first face and a second face, the test interposer having through silicon input vias and through silicon output vias with contact points on the first and second faces, the contact points on the first face of the interposer being coupled with contact points on the first face of the integrated circuit die, the test interposer including:
      (1) a first multiplexer having a first input coupled with the through silicon input vias of the test interposer, a control input, and an output coupled with the through silicon input vias of the integrated circuit die;
      (2) a second multiplexer having a first input coupled with the through silicon input vias of the test interposer, a control input, and an output coupled with the through silicon input vias of the integrated circuit die;
      (3) response collector circuitry having an input coupled with a through silicon via of the integrated circuit, a control input, and an output; and
      (4) test access port circuitry having a test data input, a test clock input, a test mode select input, and a test data output, the test access port circuitry having control leads coupled to the first multiplexer, the second multiplexer, and the response collector, and an input coupled to the output of the response collector.

2. The device of claim 1 in which the test access port circuitry includes:
   (A) a state machine having a clock input coupled with the test clock input, a mode input coupled with the test mode select input, and control outputs,
   (B) an instruction register having a data input coupled with the test data input, a data output, and a control input coupled with a control output of the state machine,
   (C) a data register having a data input coupled with the test data input, a data output, and a control input coupled with a control output of the state machine, and
   (D) multiplexer circuitry having a first input coupled with the data output of the instruction register, a second input coupled with the data output of the data register, a control input coupled with a control output of the state machine, and a data output coupled with the test data output.

3. The device of claim 1 in which the contact points on the first face of the interposer are directly connected with the contact points on the first face of the integrated circuit die.

4. The device of claim 1 including another integrated circuit die between the first face of the integrated circuit die and the test interposer and in which the contact points on the first face of the test interposer are coupled with the contact points on the first face of the integrated circuit die through the another integrated circuit die.

5. The device of claim 1 including a substrate, the test interposer is mounted on the substrate, and the second face of the test interposer faces the substrate.

6. The device of claim 1 in which the test access port circuitry includes a state machine having a clock input coupled with the test clock input, a mode input coupled with the test mode select input, and control outputs, the state machine operating through states of Test Logic Reset, Run Test Idle, Select-DR And Select-IR.

* * * * *